United States Patent
Pawlowski

(10) Patent No.: US 11,221,910 B2
(45) Date of Patent: Jan. 11, 2022

(54) MEDIA SCRUBBER IN MEMORY SYSTEM

(71) Applicant: Micron Technology, Inc., Boise, ID (US)

(72) Inventor: Joseph Thomas Pawlowski, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 65 days.

(21) Appl. No.: 16/516,936

(22) Filed: Jul. 19, 2019

(65) Prior Publication Data

US 2020/0034228 A1 Jan. 30, 2020

Related U.S. Application Data

(60) Provisional application No. 62/702,765, filed on Jul. 24, 2018.

(51) Int. Cl.
*G06F 11/00* (2006.01)
*G06F 11/10* (2006.01)
*G06F 3/06* (2006.01)

(52) U.S. Cl.
CPC ........ *G06F 11/1004* (2013.01); *G06F 3/0608* (2013.01); *G06F 3/0659* (2013.01); *G06F 3/0673* (2013.01)

(58) Field of Classification Search
CPC .. G06F 11/1004; G06F 3/0608; G06F 3/0659; G06F 3/0673
See application file for complete search history.

(56) References Cited

U.S. PATENT DOCUMENTS

| | | | |
|---|---|---|---|
| 8,898,546 B1* | 11/2014 | Kou | H03M 13/3746 714/773 |
| 9,535,782 B2* | 1/2017 | Agrawal | G06F 3/0673 |
| 9,842,021 B2* | 12/2017 | Halbert | G06F 11/1068 |
| 10,228,999 B2* | 3/2019 | Chinnakkonda Vidyapoornachary | G11C 29/52 |
| 10,339,042 B2* | 7/2019 | Oh | G11C 29/76 |
| 10,339,343 B2* | 7/2019 | Helmick | G06F 21/60 |
| 10,628,248 B2* | 4/2020 | Chinnakkonda Vidyapoornachary | G06F 11/073 |
| 10,740,453 B2* | 8/2020 | Marking | H04L 63/065 |

(Continued)

OTHER PUBLICATIONS

ISA/KR, International Search Report and Written Opinion of the International Searching Authority, Int'l. Appl. No. PCT/US2019/043052, dated Nov. 6, 2019, Korean Intellectual Property Office, Seo-gu, Daejeon, Republic of Korea, 11 pgs.

*Primary Examiner* — Esaw T Abraham
(74) *Attorney, Agent, or Firm* — Holland & Hart LLP

(57) ABSTRACT

Methods, systems, and devices for media scrubber operations in a memory system are described. A controller may, for example, count a quantity of forwarded code words in a memory medium during a scrubbing period. The controller may add the quantity to a total quantity of forwarded code words in the memory medium. The controller may refrain from forwarding additional code words based on the quantity. The controller may write a valid logic state to a spare bit when the spare bit is assigned to an erroneous bit in a code word. A separate memory cell may indicate a change in spare bit assignments and whether spare bits include valid logic states. The controller may retrieve a code word from a memory medium and invert one or more bits of the code word before writing the code word to the memory medium.

20 Claims, 8 Drawing Sheets

(56) References Cited

U.S. PATENT DOCUMENTS

| | | | |
|---|---|---|---|
| 2008/0244188 A1* | 10/2008 | Yoshida | G11B 20/1883 |
| | | | 711/137 |
| 2014/0229793 A1* | 8/2014 | Campbell | G06F 11/1012 |
| | | | 714/763 |
| 2014/0229799 A1 | 8/2014 | Hubris et al. | |
| 2015/0212882 A1 | 7/2015 | Manning et al. | |
| 2016/0004595 A1 | 1/2016 | Thiruvengadam et al. | |
| 2017/0139641 A1* | 5/2017 | Cha | G11C 11/4076 |
| 2018/0189136 A1 | 7/2018 | Wang | |

\* cited by examiner

MEDIA SCRUBBER IN MEMORY SYSTEM

CROSS REFERENCE

The present Application for Patent claims priority to U.S. Provisional Patent Application No. 62/702,765 by Pawlowski, entitled "MEDIA SCRUBBER IN MEMORY SYSTEM" filed Jul. 24, 2018, which is assigned to the assignee hereof and is expressly incorporated by reference in its entirety.

BACKGROUND

The following relates generally to operating a memory subsystem or system and more specifically to media scrubber operations in a memory system.

A computing system may include a memory subsystem or system including various kinds of memory devices and controllers that are coupled with one or more buses to manage information in numerous electronic devices such as computers, wireless communication devices, internet of things, cameras, digital displays, and the like. Memory devices are widely used to store information in such electronic devices. Information is stored by programing different states of a memory device. For example, binary devices have two states, often denoted by a logic "1" or a logic "0." In other systems, more than two states may be stored in memory devices. To access the stored information, a component of the electronic device may read, or sense, the stored state in the memory device. To store information, a component of the electronic device may write, or program, the state in the memory device.

Various types of memory devices exist, including magnetic hard disks, random access memory (RAM), read only memory (ROM), dynamic RAM (DRAM), synchronous DRAM (SDRAM), ferroelectric RAM (FeRAM), magnetic RAM (MRAM), resistive RAM (RRAM), flash memory, not-AND (NAND) memory, phase change memory (PCM), and others. Memory devices may be volatile or non-volatile. Non-volatile memory cells may maintain their logic states for extended periods of time even in the absence of an external power source. Volatile memory cells (e.g., DRAM cells) may lose their stored state over time when disconnected from an external power source.

Improving a computing system may include enhancing a memory system's performance, such as reducing power consumption, increasing memory capacity and reliability, improving read/write speeds, providing non-volatility by use of persistent memory media, or reducing manufacturing costs at a certain performance point, among other metrics.

DETAILED DESCRIPTION

Figure 1:
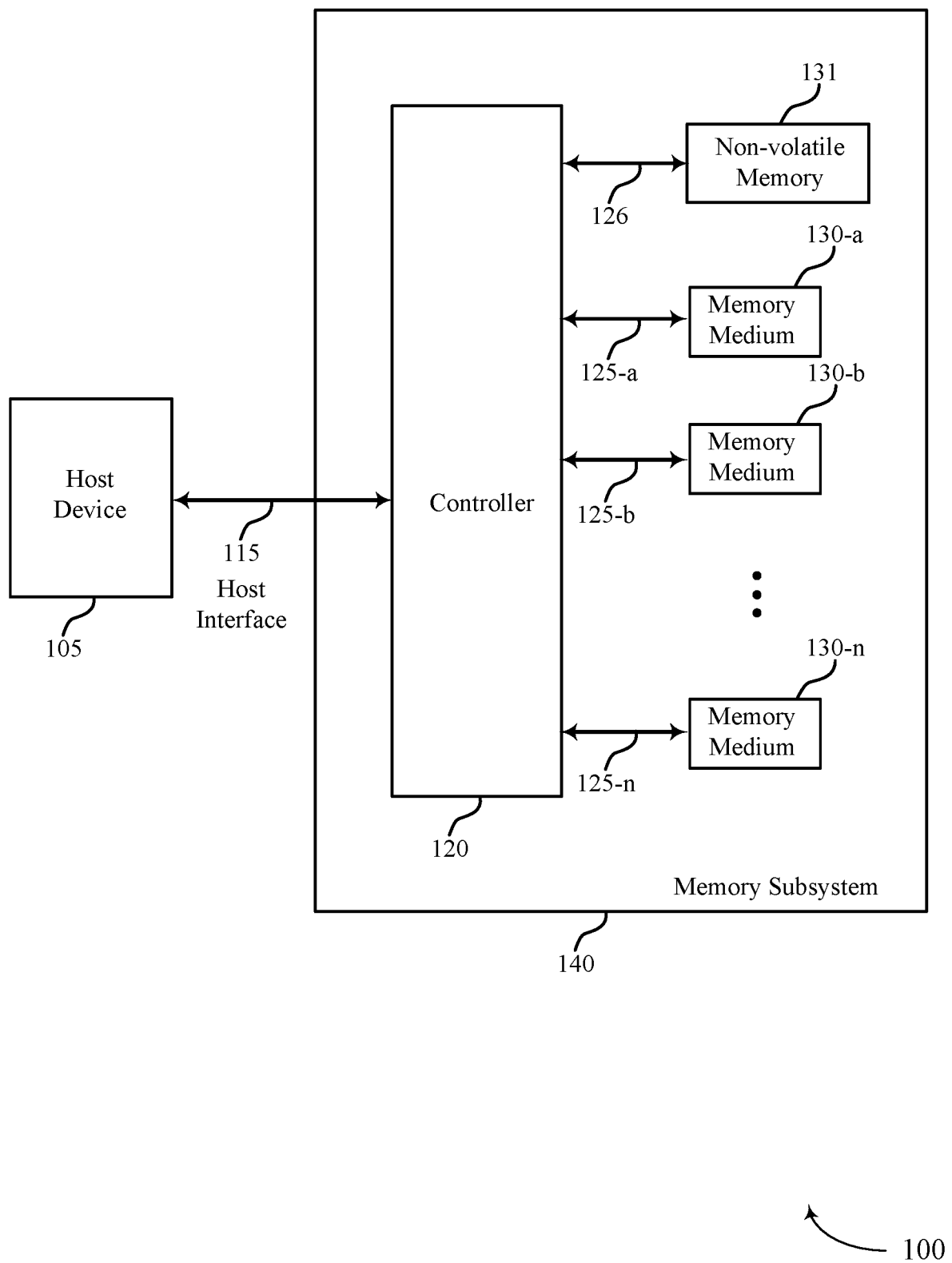
FIG. 1 illustrates an example of a computing system that supports media scrubber operations in a memory system in accordance with aspects disclosed herein.

Performance of a computing system (e.g., a server including a memory system or subsystem) may depend on various factors, such as supplying reliable information to the computing system with a low latency (e.g., a load-to-use latency). In the context of a computing system or subsystem, data carrying information may be referred to as a code word. In some cases, a code word may include an amount of user data and additional bits (e.g., bits supporting an error control operation) carrying various information to provide reliable user data with a low latency. A code word may be associated with elements of a computing system, such as a memory medium of a memory system or subsystem, and may be transmitted and received during one or more access operations, or a background operation, or both. A background operation in a computing system may refer to a process that runs without external or user intervention (e.g., an access command from a host device).

In some cases, memory cells of one or more memory dice in a memory medium may support a finite quantity of access operations (e.g., read cycles or write cycles, or both) before becoming unreliable or problematic. In some cases, the memory cells may undergo changes in electrical characteristics (e.g., a threshold voltage of a memory cell) after a certain period of time absent an access operation. Such changes (e.g., an increased threshold voltage of a memory cell) may adversely affect an operating window of the memory cells such that an error rate, such as a raw bit error rate (RBER), of the memory medium may increase. When a memory cell becomes unreliable (e.g., due to the finite quantity of access operations that a memory cell may support or inherent changes in electrical characteristics of a memory cell absent access operations, or both), information the memory cell produces may become faulty, less reliable, or invalid, and such a memory cell (or information produced by the memory cell) may be referred to as an erroneous bit. When a quantity of memory cells associated with a code word generate erroneous bits, the code word (e.g., user data in the code word) may become faulty, less reliable, or invalid beyond an error recovery capability of a memory system or subsystem.

In some cases, one or more spare bits in a code word may be assigned to replace erroneous bits in the code word. In some cases, an overall erratic status of a code word may warrant configuring the code word as a forwarded code word that points to a different address to retrieve reliable user data. In some cases, performing access operations (e.g., read operation, write operation) may mitigate undesired changes in electrical characteristics of memory cells that retain code words. Thus, operations that may efficiently perform various functions described herein (e.g., assigning one or more spare bits to replace erroneous bits in a code word, writing one or more spare bits with valid information to replace erroneous bits supporting low-latency operations, counting and monitoring a quantity of forwarded code words retained at a memory medium, periodically performing access operations for a set of code words retained at a memory medium) may improve a system's reliability. In some cases, the various functions described herein may be referred to as media scrubber operations and may be carried out as part of one or more background operations to improve overall performance of a computing system.

A controller (e.g., a port manager associated with the memory medium) may, as part of a media scrubber operation in some cases, count or monitor a quantity of forwarded code words retained in a memory medium. The controller may identify a value of a first counter associated with the memory medium. The first counter may indicate a quantity of code words that are configured as forwarded code words during a scrubbing period (e.g., a duration during which a media scrubber operation may be performed for a memory medium). The controller may set (e.g., initially set, update) a value of a second counter associated with the memory medium based on the value of the first counter, where the second counter may indicate a total quantity of forwarded code words that may be accumulated in the memory medium during a lifetime of the memory medium. A lifetime of a memory medium may refer to an estimated duration within which the memory medium satisfies a set of operating criteria.

The controller may also reset the value of the first counter based on setting the value of the second counter before initiating a next scrubbing period to count another quantity of code words configured as forwarded code words during the next scrubbing period. In this manner, the controller may count a quantity of code words configured as forwarded code words during a given scrubbing period and may accumulate a total quantity of forwarded code words retained at the memory medium over a lifetime of the memory medium. In some cases, the controller may refrain from configuring additional code words as forwarded code words based on the quantity of forwarded code words either during a scrubbing period or during a lifetime of the memory medium.

A memory array of a memory die may be configured to include a set of Minimum Substitution Regions (MSRs). An MSR may be configured as a reasonable fault containment zone to efficiently manage (e.g., replace, substitute) erroneous bits in the memory array. In some cases, an MSR may include a group of memory cells configured as a unit of data associated with an error control operation. Further, each bit of a code word (e.g., each of 1,408 bits in a code word) may be associated with a respective MSR of the set (e.g., 1,408 MSRs). A group of MSRs across a set of channels of the memory medium (e.g., a group of MSRs operating in parallel) may retain a quantity of code words. The group of MSRs configured to produce the quantity of code words may be referred to as an MSR strip or an MSR region. In some cases, an MSR strip may be associated with a bit (e.g., a flag) in a separate memory array, where the bit may be configured to indicate a change in a substitution relationship (e.g., one or more indications of spare bit assignments to replace one or more erroneous bits) for the quantity of code words retained at the MSR strip.

The controller may, as part of a media scrubber operation (e.g., during a first media scrubbing period for an MSR strip) in some cases, assign one or more spare bits (e.g., one or more MSRs corresponding to the spare bits) in a code word to replace erroneous bits (e.g., MSRs corresponding to the erroneous bits) in the code word (e.g., one of the quantity of code words retained at the MSR strip). The controller may set the bit (e.g., the flag) in the separate memory array to indicate such a change in the substitution relationship associated with the code word retained at the MSR strip. Setting the bit (e.g., the flag) may also indicate that a spare bit may not include a valid logic state for the code word although the substitution relationship for the spare bit may have been determined.

The controller may, as part of a media scrubber operation (e.g., during a second media scrubbing period for the MSR strip) in some cases, access the code word, replace the erroneous bits with the one or more spare bits according to the substitution relationship saved in the separate memory array, and perform an error control operation to restore logic states for the code word (e.g., the code word including the one or more spare bits that substituted the erroneous bits). The controller may write the restored logic states (e.g., valid logic states) at the one or more spare bits and may reset the bit (e.g., the flag) in the separate memory array. In this manner, the one or more spare bits may include valid logic states for the code word and the bit (e.g., the flag) may indicate that the one or more spare bits include valid logic states to be implemented (e.g., multiplexed with a series of data burst into a bit stream of the code word) when a host requests the code word.

The controller may, as part of a media scrubber operation in some cases, retrieve a code word from a memory medium, invert at least some, if not all, of the bits of the code word before writing the code word back to the memory medium. Writing the code word back to the memory medium may mitigate undesired changes in electrical characteristics of memory cells that retain the code word—e.g., a drift in a threshold voltage of a memory cell that may happen over an extended period of time absent an access operation. Inverting a logic state of a memory cell (e.g., writing a logic "1" to memory cells retaining a logic "0" or vice versa) may further mitigate the undesired changes in electrical characteristics of the memory cells.

Features of the disclosure introduced herein are further described below at an exemplary system level in the context of FIG. 1. Specific examples of a system and a configuration of a memory medium of the system are then described in the context of FIGS. 2 through 4. These and other features of the disclosure are further illustrated by and described with reference to an apparatus diagram of FIG. 5 that describes various components related to a controller as well as flowcharts of FIGS. 6 through 8 that relate to operations of media scrubber operations in a memory system.

FIG. 1 illustrates an example of a computing system 100 that supports media scrubber operations in a memory system in accordance with aspects disclosed herein. The computing system 100 may include a host device 105 coupled with a device 140 through a host interface 115 (which may also be referred to as a host link). The host device 105 may be or include a server, a system on a chip (SoC), a central processing unit (CPU), or a graphics processing unit (GPU), among other examples. In some examples, the host device 105 may access (e.g., read from, write to) one or more memory media 130 located in the device 140 through the host interface 115.

The host interface 115 (e.g., a host link) may be compatible with or employ a protocol (e.g., the Gen-Z, the Cache Coherent Interconnect for Accelerators (CCIX) protocol) to facilitate access operations between the host device 105 and the one or more memory media 130. The host interface 115 may be configured to transfer data at a first data transfer rate (e.g., 25 gigabytes per second (GBps)) in at least one direction (e.g., sending or receiving). In some examples, a 25 GBps data transfer rate may support approximately 586 million transactions per second when a transaction size is 64 bytes. In other examples, a 25 GBps data transfer rate may support approximately 312.5 million transactions per second when a transaction size is 128 bytes.

The device 140 may, in some cases, be referred to as a memory system or subsystem, or a memory device. In some cases, the device 140 may include a power management component. The power management component may monitor a power level that may indicate a power change or loss related to the device 140 or the computing system 100. In some cases, the power level may fluctuate beyond a normal range to indicate such a power change or loss incident. The device 140 may include a controller 120 that may be coupled with one or more memory media 130 through channels 125. In some cases, the channels 125 may be referred to as aggregated channels 125 including a plurality of other channels (e.g., channels having a smaller bandwidth than the aggregated channel 125) as described with reference to FIG. 2. The device 140 may include a non-volatile memory 131 that is coupled with the controller 120 through a channel 126. In some examples, the controller 120, the one or more memory media 130, or the non-volatile memory 131, or any combination thereof, may be integrated with, in contact with, or placed on a board (e.g., a peripheral component interconnect express (PCIe) board). In some cases, the non-volatile memory 131 may be integrated as part of the controller 120.

The controller 120 may include various functional blocks that facilitate operations of the device 140 in conjunction with the one or more memory media 130. In some case, the power management component may be integrated as part of the controller 120. In some cases, the controller 120 may include aspects of an interface controller to accommodate different specifications, constraints, or characteristics associated with the host interface 115, the channels 125, the channel 126, or any combination thereof. In some examples, the controller 120 may be an ASIC, a general-purpose processor, other programmable logic device, discrete hardware components (e.g., a chiplet), or it may be a combination of components.

In some cases, the controller 120 may read data from or write data at a memory medium 130 (e.g., a memory medium 130-*a*) in conjunction with a local controller (e.g., local to the memory medium 130-*a*) that may perform various operations (e.g., writing data to memory cells, reading data from memory cells, arranging a code word in accordance with a code word format described with reference to FIG. 3). In some examples, the local controller may send requested data to the controller 120 through one of the channels 125, which may be an example of an aggregated channel.

Each memory medium (e.g., a memory medium 130-*a*) may include multiple memory dice (e.g., forty-four (44) memory dice) to obtain a specified or desired memory capacity of the memory medium. In some examples, the memory dice may include a three-dimensional cross-point array of memory cells including chalcogenide (e.g., 3DXP memory dice including 3D XPoint™ memory cells). In other examples, the memory dice may include other kinds of memory devices (e.g., FeRAM dice, MRAM dice, PCM dice). In some examples, a code word (e.g., a code word including 128 bytes of user data) may be divided across the multiple memory dice within a memory medium (e.g., a memory medium 130-*a*).

In some cases, each memory die (e.g., each 3DXP memory die) of the multiple memory dice may produce a quantity of data (e.g., 128 bits of data) as a unit from the memory die in association with an access operation (e.g., a read operation). The amount of data (e.g., 128 bits of data) may include a sequence of bursts (e.g., sixteen (16) bursts), each burst including an amount of data (e.g., eight (8) bits of data) transmitted over a bus (e.g., 8-bits wide bus) from the memory die. As an example, when a memory medium includes eleven (11) memory dice operating in parallel, and when each memory die of the eleven (11) memory dice produces eight (8) bits of data at a given burst, the memory medium may produce 88 bits of data for the given burst. As eleven (11) memory dice may produce data over a total of sixteen (16) bursts, each burst including 88 bits of data from eleven (11) memory dice, a unit of data associated with the memory medium during an access operation—e.g., the unit of data transmitted over the channel (e.g., an aggregated channel)—may include 1,408 bits.

As such, a code word (e.g., a unit of data during a transaction of an access operation) associated with a memory medium may include 1,408 bits, in this example. In some cases, a burst may be referred to as a channel burst or a data burst. In some cases, a channel between the controller 120 and a memory medium (e.g., a memory medium 130-*a*) may include a plurality of channels, in which each channel may be associated with one or more memory dice of the memory medium (e.g., a memory medium 130-*a*) as described with reference to FIGS. 3 and 4.

A memory medium (e.g., a memory medium 130-*a*) may include a set of memory dice that each include a memory array. Each memory die of the set (e.g., each memory array) may be configured to include a set of MSRs as described with reference to FIG. 4. An MSR may be configured as a reasonable fault containment zone to efficiently manage (e.g., replace, substitute) erroneous bits in the memory array. Further, at least some, if not each, MSRs of the set may be associated with a counter configured to count a quantity of erroneous bits in the MSRs of the set.

The channels 125 may be configured to transport data (e.g., a code word) between the controller 120 and the one or more memory media 130. Each of the channels 125 (e.g., the channel 125-*a* that may be an example of an aggregated channel) may include a plurality of other channels (e.g., channels having a smaller bandwidth than the channel 125-*a*) for transporting data (e.g., a code word) in parallel. In some cases, a code word may include user data (e.g., 128 bytes of user data in a code word) and other sets of data (e.g., remaining data in the code word to produce reliable data with a low latency). Each of the channels 125 (e.g., the channel 125-*a* that may be an example of an aggregated channel) may include additional channels to carry information related to various auxiliary functions such as metadata. In some cases, a code word format (which may also be referred to as a code word layout) or a forwarded code word format (e.g., a forwarded code word layout) may define how each of the channels 125 (e.g., the channel 125-*a*) may transport data (e.g., a code word) between the controller 120 and the one or more memory media 130.

The non-volatile memory 131 may include an array of non-volatile memory cells that may maintain their logic states for an extended period of time even in the absence of an external power source. For example, the non-volatile memory cells may be or include 3D XPoint™ memory cells, PCM cells, FeRAM cells, or NAND memory cells, among other examples. Further, the non-volatile memory 131 may be configured to communicate information with the controller 120 through the channel 126. For example, the non-volatile memory 131 may receive information from the controller 120 through the channel 126 and save the information when a power change or loss related to the computing system 100 is detected.

In some cases, the memory subsystem or system, which may include device 140, may include a power management component to manage a power change or loss incident. The power management component may be operable to detect a sign of power change or loss (e.g., a power level indicating a power change or loss that may occur) and transmit an indication of the sign of power change or loss to the controller 120. The controller 120 may, upon receiving the indication, transfer information (e.g., an indication of error status associated with a code word, one or more indications of spare bit assignments to erroneous bits) saved in a memory array (e.g., SRAM memory array) in the controller 120 to the non-volatile memory 131. The non-volatile memory 131 may save the information such that the information may be preserved in the absence of a power supply to the memory subsystem or system, which may include device 140. When the power to the computing system 100 is restored or otherwise adjusted, the controller 120 may retrieve the information from the non-volatile memory 131 to resume an operation that has been interrupted by the power change or loss incident based on the information preserved in the non-volatile memory 131.

The controller (e.g., the controller 120) may, as part of a media scrubber operation in some cases, count a quantity of forwarded code words retained in a memory medium (e.g., a memory medium 130-a). A forwarded code word may include a quantity of duplicates of a forwarding address for a code word as described with reference to FIG. 3. The controller 120 may identify a value of a first counter associated with the memory medium. The first counter may indicate a quantity of code words that are configured as forwarded code words during a scrubbing period (e.g., a duration during which a media scrubber operation may be performed for a memory medium). The controller may set (e.g., initially set, update) a value of a second counter associated with the memory medium based on the value of the first counter, where the second counter may indicate a total quantity of forwarded code words that may be accumulated in the memory medium during a lifetime of the memory medium. A lifetime of a memory medium may refer to an estimated duration within the which the memory medium satisfies a set of operating criteria—e.g., a raw bit error rate (RBER) associated with memory dice included in a memory medium, a preconfigured ratio between a quantity of forwarded code words and a total quantity of code words retained in a memory medium, or a load-to-use latency, among other examples.

The controller 120 may also receive a first code word from the memory medium based on setting the value of the second counter. In some cases, the controller 120 may initiate a next scrubbing period by receiving the first code word from the memory medium. In some cases, the controller 120 may also reset the value of the first counter based on setting the value of the second counter before initiating the next scrubbing period to count another quantity of code words configured as forwarded code words during the next scrubbing period. A scrubbing period may be a duration based on a preconfigured period of retrieving a set of code words from the memory medium. For example, the preconfigured period for performing one or more media scrubber operations may correspond to several hours. In some cases, the controller 120 may receive the first code word by retrieving the first code word as part of a periodic background operation (e.g., a media scrubber operation) independent of an access command from a host.

In this manner, the controller 120 may count a quantity of code words configured as forwarded code words during a given scrubbing period and may accumulate a total quantity of forwarded code words retained at the memory medium (e.g., a memory medium 130-a) over a lifetime of the memory medium. In some cases, the controller may refrain from configuring additional code words as forwarded code words based on the quantity of forwarded code words either during a scrubbing period or during a lifetime of the memory medium.

Figure 2:
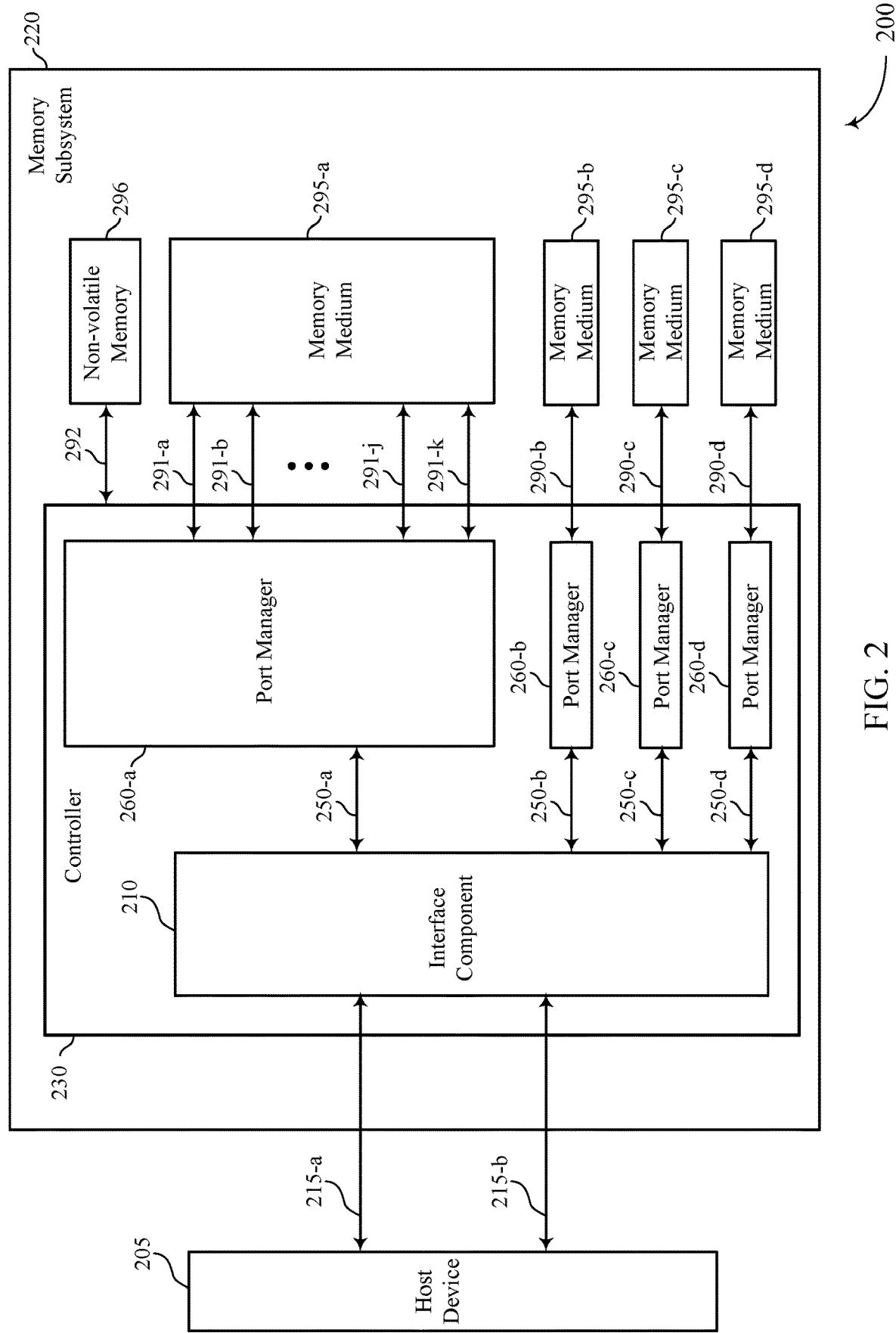
FIG. 2 illustrates an example of a computing system that supports media scrubber operations in a memory system in accordance with aspects disclosed herein.

FIG. 2 illustrates an example of a computing system 200 that supports media scrubber operations in a memory system in accordance with aspects disclosed herein. The computing system 200 may be an example of the computing system 100 described with reference to FIG. 1. The computing system 200 may include a host device 205 coupled with a memory subsystem or system 220 using at least one host interface (e.g., a host interface 215-a). In some cases, the host interfaces 215 may be referred to as a host link or host links. The host device 205 may be an example of the host device 105 described with reference to FIG. 1. The host interfaces 215 may be examples of the host interface 115 described with reference to FIG. 1. In some examples, the host interfaces 215 may be configured to transfer data at a first data transfer rate (e.g., 50 GBps with 25 GBps in each direction).

The computing system 200 may include the memory subsystem or system 220. The memory subsystem or system 220 may be an example of the device 140 described with reference to FIG. 1. The memory subsystem or system 220 may be referred to as a memory device or memory devices. The memory subsystem or system 220 may include a controller 230. In some cases, the memory subsystem or system 220 may include a power management component. The power management component may monitor a power level that may indicate a power change or loss related to the memory subsystem or system 220 or the computing system 200. In some cases, the power level may fluctuate beyond a normal range to indicate such a power change or loss incident. The controller 230 may be an example of the controller 120 described with reference to FIG. 1. The controller 230 may include an interface component 210 and a plurality of port managers 260. In some cases, the power management component may be integrated as part of the controller 230.

The interface component 210 may be configured to facilitate data exchange between the host device 205 and the memory subsystem or system 220 through the host interfaces 215. The interface component 210 may be configured to exchange data with the plurality of port managers 260 (e.g., using signal paths 250). Each signal path of the signal paths 250 may be configured to exchange data at a rate (e.g., 12.8 GBps) different than the first data transfer rate of the host interfaces 215. In some cases, the interface component 210 may be configured to provide a routing network function to allow more than one host interface (e.g., host interface 215-a and host interface 215-b) to be associated with the plurality of port managers 260.

The memory subsystem or system 220 may include a non-volatile memory 296. The non-volatile memory 296 may be configured to communicate information with the controller 230 through a channel 292. The non-volatile memory 296 may be an example of the non-volatile memory 131 described with reference to FIG. 1. Also, the channel 292 may be an example or include aspects of the channel 126 described with reference to FIG. 1. Further, the non-volatile memory 296 may be configured to communicate information with port managers 260 in the controller 230. For example, the port managers 260 may transfer various information (e.g., an indication of error status associated with a code word, one or more indications of spare bit assignments to erroneous bits) to the non-volatile memory 296 through the channel 292 and save the information in the non-volatile memory 296 when the port managers 260 receive an indication of a power change or loss related to the computing system 200 or the memory subsystem or system 220. In some cases, the non-volatile memory 296 may be integrated as part of the controller 230.

Each port manager (e.g., the port manager 260-*b*) of the plurality of the port managers 260 may be coupled with a memory medium (e.g., the memory medium 295-*b*) through an aggregated channel (e.g., the aggregated channel 290-*b*). In some cases, each port manager of the plurality may be coupled with different one or more memory media 295. In some examples, an individual port manager (e.g., the port manager 260-*a*) of the plurality of port managers 260 may operate independent of each other (e.g., the port managers 260-*b*, 260-*c*, and 260-*c*) and may support access operations or background operations associated with one or more memory media 295. The one or more memory media 295 may be examples of the one or more memory media 130 described with reference to FIG. 1. In some cases, each of the one or more memory media 295 may be referred to as a media port.

Each aggregated channel of the aggregated channels 290 may include one or more channels 291. In some cases, the channels 291 may be referred to as logic channels 291. In some examples, each channel 291 may be associated with one or more memory dice in a memory medium (e.g., the memory medium 295-*a*) and may have a smaller bandwidth than the bandwidth of the aggregated channel (e.g., the aggregated channel 290-*b*). In some examples, an aggregated channel (e.g., an aggregated channel 290-*a*) may include eleven (11) channels 291 (e.g., channels 291-*a* through 291-*k*). As a person of ordinary skill in the art would appreciate, the plurality of channels 291 (e.g., the channels 291-*a* through the channel 291-*k*) are depicted for the port manager 260-*a* representing one of the aggregated channels 290 (e.g., the aggregated channel 290-*a*) while the other aggregated channels 290 (e.g., the aggregated channels 290-*b*, 290-*c*, and 290-*d*) are depicted for port managers 260-*b*, 260-*c*, and 260-*d* without showing the plurality of channels 291 associated with each aggregated channel, which is so depicted in order to increase visibility and clarity of the illustrated features.

An individual memory medium (e.g., the memory medium 295-*a*) of the one or more memory media 295 may include one or more memory devices (e.g., 3DXP memory dice). In some cases, the memory devices in the individual memory medium may be configured to operate in parallel to obtain a desired (or a specified) aggregated bandwidth through one of the aggregated channels 290. A 3DXP memory die, as one example, may be configured to have a 8-bits wide data bus and may be associated with each of channels 291 (e.g., the channel 291-*a*) rendering each channel 291 being 8-bits wide. In addition, a 3DXP memory die may be configured to produce 128-bits of data during a sequence of sixteen (16) bursts, in which each burst may produce 8-bits wide data over the channel 291. As such, 128-bits of data may be considered as a single unit of data that each 3DXP memory die generates based on an access command (or during a background operation) reading memory cells within the 3DXP memory die.

In some cases, a code word (or a forwarded code word) may be configured to include a set of bit fields indicative of a plurality of data bursts (e.g., a sequence of sixteen (16) bursts) across a plurality of channels (e.g., eleven (11) channels 291-*a* through 291-*k* generating 88 bits of data per data burst). As such, the code word may in some cases include 1,408 bits of information. The description herein may be understood from a logical view of the memory medium. A larger quantity of physical 3DXP memory dice than a quantity of logical 3DXP memory dice may be present in a memory medium accounting for an overhead related to various access operations (e.g., read operation, write operation) or background operations associated with the memory medium. Within a memory medium, a code word may be divided into parts and written to or read from more than one die (e.g., 128 byte user data retained across ten (10) 3DXP memory dice) as described with reference to FIG. 3.

Various examples described herein use 3DXP memory dice (e.g., including 3D) XPoint™ memory cells) to illustrate how the memory media 295 may be configured and operate in conjunction with the port managers 260 in accordance with the methods, devices, and systems supporting media scrubber operations in a memory system disclosed herein. In some cases, the memory media 295 may include other types of memory devices employing different memory technologies than 3DXP memory technology, such as FeRAM technology, PCM technology, MRAM technology, among others. As such, the concepts disclosed herein are not limited to a particular memory technology (e.g., 3D XPoint™ memory technology).

A memory medium (e.g., a memory medium 295-*a*) may include a set of memory dice that each include a memory array. Each memory die of the set (e.g., each memory array) may be configured to include a set of MSRs as described with reference to FIG. 4. An MSR may be configured as a reasonable fault containment zone to efficiently manage (e.g., replace, substitute) erroneous bits in the memory array. In some cases, each bit of a code word (e.g., each of 1,408 bits in a code word) may be associated with a respective MSR of the set (e.g., 1,408 MSRs). A group of MSRs across a set of channels of a memory medium (e.g., channels 291-*a* through 291-*k* of the memory medium 295-*a*) may be configured to operate in parallel to retain or to generate a quantity of code words. The group of MSRs configured to produce the quantity of code words may be referred to as an MSR strip or an MSR region, in some cases. Further, at least some, if not each, MSR of the set may be associated with a counter configured to count a quantity of erroneous bits in the MSRs of the set.

A port manager (e.g., a port manager 260-*a*) may, as part of a media scrubber operation in some cases, count a quantity of forwarded code words retained in a memory medium (e.g., a memory medium 295-*a*). A forwarded code word may include a quantity of duplicates of a forwarding address for a code word as described with reference to FIG. 3. The port manager 260-*a* may identify a value of a first counter associated with the memory medium. The first counter may indicate a first quantity of code words that are configured as forwarded code words during a first duration. In some cases, the first duration may be based on a preconfigured period of retrieving a set of code words from the memory medium. The port manager 260-*a* may set (e.g., initially set, update) a value of a second counter associated with the memory medium based on the value of the first counter, where the second counter may indicate a second quantity of forwarded code words that may be accumulated in the memory medium during a second duration. In some cases, the second duration may be based on a lifetime (e.g., an estimated duration within the which the memory medium satisfies a set of operating criteria) of the memory medium. The port manager 260-*a* may also receive a first code word from the memory medium based on setting the value of the second counter.

In some cases, the port manager 260-*a* may determine that the first code word satisfies a condition for configuring the first code word as a forwarded code word. The condition may be based on a quantity of erroneous bits in the first code word as described with reference to FIG. 3. The port manager 260-*a* may also configure the first code word as a forwarded code word based on determining that the first code word satisfies the condition. In some cases, the port manager 260-*a* may write the first code word back to the memory medium (e.g., a memory medium 295-*a*) based on configuring the first code word as a forwarded code word.

In some cases, the port manager 260-*a* may update the value of the first counter based on configuring the first code word as a forwarded code word. The port manager 260-*a* may also determine the updated value of the first counter relative to a first threshold that is associated with a quantity of forwarded code words retained at the memory medium. In some cases, the first threshold may be related to a quantity of code word forwarding events allowed during the first duration. In some cases, the quantity of code word forwarding events may be preconfigured based on a ratio between a total quantity of forwarded code words budgeted in a memory medium and a total quantity of code words retained in the memory medium. In other cases, the first threshold may be related to one or more defect mechanisms that may render a cluster of memory cells unreliable or problematic. As a result of updating the value of the first counter (e.g., configuring a code word as a forwarded code word during a scrubbing period), the port manager 260-*a* may determine that the value of the first counter (e.g., an updated quantity of code word forwarding events) may be equal to or within a determined range of the quantity of code word forwarding events allowed during the first duration.

Further, the port manager 260-*a* may receive a second code word from the memory medium based on updating the value of the first counter. The port manager 260-*a* may also determine that the second code word satisfies the condition for configuring the second code word as a forwarded code word based on receiving the second code word. In some cases, the port manager 260-*a* may refrain from configuring the second code word as a forwarded code word based on the updated value of the first counter relative to the first threshold. For example, the port manager 260-*a* may initiate an alternative error control scheme (e.g., substituting a channel of a code word) instead of configuring the second code word as a forwarded code word. Substituting a channel of a code word may be a more effective scheme of managing erroneous bits in the code word when the erroneous bits may be due to one or more defect mechanisms associated with a memory die of the memory medium.

In some cases, the port manager 260-*a* may determine that the first code word corresponds to a last code word retained at the memory medium (e.g., a media scrubber operation completing a current scrubbing period). The port manager 260-*a* may also update the value of the second counter based on updating the value of the first counter and determining that the first code word corresponds to the last code word retained at the memory medium. In some cases, the port manager 260-*a* may determine the updated value of the second counter relative to a second threshold associated with the quantity of forwarded code words retained at the memory medium. The port manager 260-*a* may also refrain from configuring a code word as a forwarded code word based on the updated value of the second counter. In some cases, the second threshold may be related to a quantity of code word forwarding events allowed during a lifetime of a memory medium. In some cases, the quantity of code word forwarding events allowed during the lifetime of the memory medium may be preconfigured based on a ratio between a total quantity of forwarded code words budgeted for the memory medium and a total quantity of code words retained in the memory medium.

Figure 3:
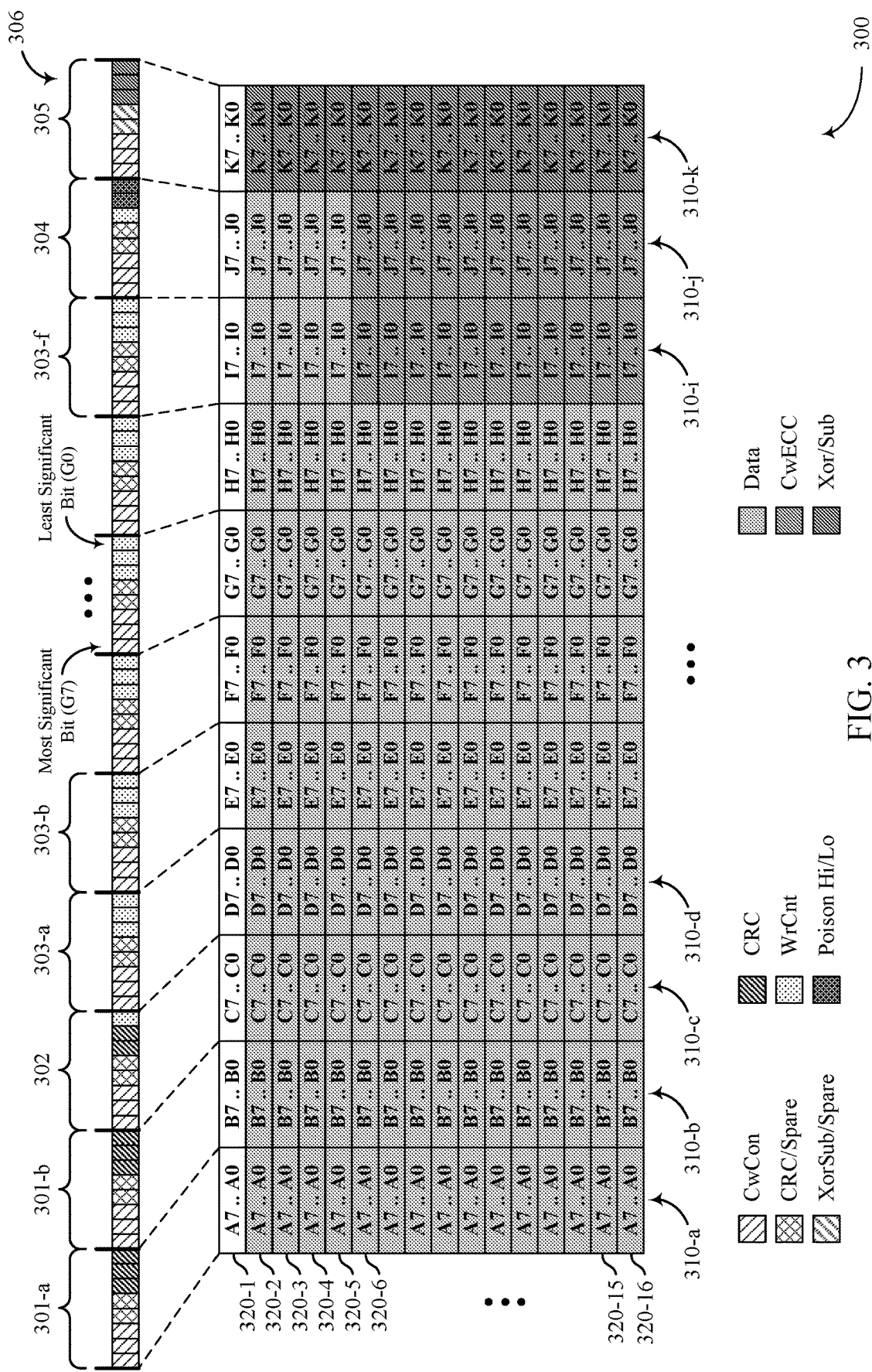
FIG. 3 illustrates an example of a code word format that supports media scrubber operations in a memory system in accordance with aspects disclosed herein.

FIG. 3 illustrates an example of a code word format 300 (which may also be referred to as a code word layout 300) that supports media scrubber operations in a memory system in accordance with aspects disclosed herein. The code word format 300 may be an example of a code word format for an entire code word. A code word may include a set of bit fields indicative of a plurality of data bursts across a plurality of channels (e.g., channels 291-*a* through 291-*k* described with reference to FIG. 2). FIG. 3 also includes formats 301 through 305 (also referred to as layouts) illustrating various configurations for an individual channel (e.g., the channel 291-*a* described with reference to FIG. 2). FIG. 3 also illustrates a format 306, which may correspond to a portion of a code word (e.g., a subset of bit fields during one or more first data bursts across the plurality of channels).

As an example of a code word format and structure, the code word format 300 may include a quantity of fields (e.g., bit fields) of data (e.g., 1,408 bits of data) that may be produced by a memory medium (e.g., the memory medium 130-*a* or the memory medium 295-*a* described with reference to FIGS. 1 and 2) in response to an access command, or during a background operation, or both. The code word may include 128 bytes (e.g., 1,024 bits) of user data. Remaining bit fields within the code word (e.g., 384 bits of data) may carry various information that may facilitate transferring of accurate user data during an access operation, or during a background operation, or both. Further, the remaining bits carrying the various information may be configured to facilitate low-latency operations (e.g., spare substitution) associated with the code word during an access operation.

The code word format 300 may span a plurality of channels (e.g., channels 310-*a* through 310-*k*). One of these channels (e.g., channels 310-*a* through 310-*k*) may be an example of or include aspects of a channel 291 (e.g., a channel 291-*a*) described with reference to FIG. 2. In some cases, each channel (e.g., the channel 310-*a*) of the plurality of channels 310 may be associated with one or more 3DXP dice, which may include an 8-bit wide data bus. For example, each channel may produce a total of 128 bits of data as a single object of a transaction (e.g., communication, operation) associated with an access command (e.g., a read command), or a background operation, or both. Further, the 128 bits of data may be produced as a sequence of sixteen (16) data bursts, each data burst configured to produce eight (8) bits of data over the 8-bit wide data bus. Hence, each channel (e.g., each of the channels 310-*a* through 310-*k*) within a code word format may correspond to 128 bits of data including sixteen (16) groups of 8-bits of data—e.g., G7 . . . G0 for channel 310-*g*, where G7 . . . G0 may represent a series of eight (8) 0 s and 1 s in which G7 may be the most significant bit (e.g., the eighth bit of the series of eight (8) 0 s and 1 s) and G0 may be the least significant bit (e.g., the first bit of the series of eight (8) 0 s and 1 s)), in which each group of sixteen (16) groups of 8-bits of data may be associated with one of sixteen (16) data bursts.

In one example, the code word format 300 may span across eleven (11) channels and each channel of the eleven

(11) channels may produce 8-bits of data at each data burst, and a total of 88 bits of data may be produced at each data burst across the eleven (11) channels (e.g., the first data burst 320-1 of 88 bits of data). Thus, the code word format 300 may include 1,408 bits of data (e.g., the first data burst 320-1 through the 16th data burst 320-16 with each data burst producing 88 bits of data) as a single object of a transaction for a memory medium (e.g., the memory medium 130-*a* or the memory medium 295-*a*). The code word format 300 may support a reliable transaction (e.g., conveying accurate contents of user data) with a low latency (e.g., a low quantity of clock edges to produce the user data).

Each field (e.g., each bit field) or a set of fields (e.g., a set of bit fields) within a code word may include information that facilitates reliable transactions of user data with low-latency. In some cases, one or more fields (e.g., bit fields) within a code word format may be configured to indicate a code word condition (e.g., using one or more CwCon bits). A code word may be configured in one of multiple possible states (e.g., four states) indicated using the CwCon bits.

As an example, one or more CwCon bits may indicate a code word being one of a normal or a forwarded code word. A normal code word may, as one example, include the code word format 300. A forwarded code word may include a code word layout that may facilitate identification of a valid replacement address (e.g., forwarding address) for the code word. In some cases, a forwarded code word may include at least one copy of a valid address associated with the code word. Further, one or more CwCon bits may additionally or alternatively indicate a code word being one of a non-inverted code word or an inverted code word. In some cases, logic states of bits (e.g., 1 s and 0 s) within an inverted code word may need to be inverted (e.g., flipped, reversed) before information of the inverted code word may be interpreted (e.g., parsed) whereas the non-inverted code word may not need to be inverted before interpreting (e.g., parsing) information of the non-inverted code word.

A controller (e.g., a controller 120 or a port manager 260-*a* described with reference to FIGS. 1 and 2), may, as part of a media scrubber operation in some cases, retrieve a code word from a memory medium (e.g., a memory medium 130-*a* or a memory medium 295-*a* described with reference to FIGS. 1 and 2), and invert at least some, if not all, of the bits of the code word before writing the code word back to the memory medium. Writing the code word back to the memory medium may mitigate undesired changes in electrical characteristics of memory cells that retain the code word—e.g., a drift in a threshold voltage of a memory cell that may happen over an extended period of time absent an access operation. Inverting a logic state of a memory cell (e.g., writing a logic "1" to memory cells retaining a logic "0" or vice versa) may further mitigate the undesired changes in electrical characteristics of the memory cells.

In some cases, the controller may receive a code word from an address of a memory medium, the code word including a set of bits (e.g., a set of bit fields). The controller may also invert a portion of the bits based on receiving the code word. In some cases, the controller may set a value of a bit of the set (e.g., a CwCon bit) to indicate a code word condition including an inversion status of the code word based on inverting the portion of the bits. The controller may also write the code word back to the address of the memory medium based on setting the value of the bit indicating the inversion status. In some cases, the portion of the bits may include every bit of the set. In some cases, the controller may retrieve each code word of a plurality of code words retained at the memory medium as part of a periodic background operation (e.g., a media scrubber operation) independent of an access command from a host, where inverting the portion of the bits may be based on retrieving each code word of the plurality.

In some cases, one or more fields within a code word format may be configured to indicate a quantity of access operations (e.g., read operations, write operations) associated with the code word (e.g., WrCnt bits). In some cases, one or more fields within a code word format may be configured to indicate that a portion of the code word may be invalid (e.g., using poison or indicator bits). In some cases, one or more fields within a code word format may be configured as cyclic redundancy check (CRC) bits that may identify erroneous bits related to an error control operation.

In some cases, one or more fields within a code word format may be configured as code word error control code bits (e.g., CwECC bits) that support an error control operation. In some cases, one or more fields within a code word format may be configured as XOR bits. Each of the XOR bits may include a digital or Boolean logic exclusive OR (XOR) product of corresponding bits of other channels of a respective data burst. As such, the XOR bits may support repairing corresponding bits of other channels and may be referred to as repair bits. In some cases, each XOR bit (e.g., XOR/Sub bits or XORSub bits) may substitute a field within a code word instead of repairing the field.

In some cases, one or more fields within a code word format may be configured as spare bits (e.g., CRC/Spare bits, XORSub/Spare bits). The bits configured as spare bits may be configured as CRC bits or XOR bits (or XORSub bits), among other alternatives. As an example, the code word format 300 depicted in FIG. 3 may include up to twenty-two (22) spare bits—e.g., twenty (20) CRC/Spare bits and two (2) XORSub/Spare bits. Namely, some fields of CRC bits may be configured as spare bits. Similarly, some fields of repair bits (e.g., XORSub bits) may be configured as spare bits. As such, a quantity of spare bits within a code word may be configurable because the quantity of spare bits may be exchangeable for a quantity of the CRC bits or the XORSub bits. In some cases, the quantity of spare bits in a code word may be determined based on a maturity of memory technology (e.g., 3D XPoint™, FeRAM, MRAM technologies) used to build memory media (e.g., memory media 130, memory media 295).

In some cases, spare bits may be configured to operate as spares to replace bits of the code word designated to have failed (e.g., erroneous bits). In some cases, the bits designated to have failed may be associated with an MSR (e.g., an MSR including a quantity of memory cells, which may have become faulty or unreliable) of a memory die. The spare bits (e.g., MSRs corresponding to the spare bits) may be routed (e.g., multiplexed using a multiplexing component) to replace (e.g., substitute) the bits designated to have failed (e.g., MSRs corresponding to the erroneous bits) to support a reliable transaction of the user data within the code word.

Still referring to FIG. 3, various fields (e.g., bit fields) within a code word format may be configured (e.g., arranged) to support a low-latency operation during an access operation associated with a memory medium. FIG. 3 includes formats 301 through 305 illustrating various configurations of a group of 8-bits for an individual channel (e.g., each of the channels 310-*a* through 310-*k*). For example, each format of the formats 301 through 305 includes a group of eight (8) bits that a memory device (e.g., 3DXP die) within a memory medium (e.g., a memory medium 295-*a*) may produce at a given data burst. The following describes example formats, although the disclosure herein is not limited to these examples.

Format 301 may include one or more (e.g., three) fields of CwCon bits, one or more (e.g., two) fields of CRC/Spare bits (which may be configured as either CRC bits or spare bits), and one or more (e.g., three) fields of CRC bits. Format 302 may include one or more (e.g., three) fields of CwCon bits, one or more (e.g., two) fields of CRC/Spare bits (which may be configured as either CRC bits or spare bits), one or more (e.g., two) fields of CRC bits, and one or more WrCnt bits (e.g., a counter bit).

Format 303 may include one or more (e.g., three) fields of CwCon bits, one or more (e.g., two) fields of CRC/Spare bits (which may be configured as either CRC bits or spare bits), and one or more (e.g., three) fields of WrCnt bits (e.g., a counter bit). Format 304 may include one or more (e.g., three) fields of CwCon bits, one or more (e.g., two) fields of CRC/Spare bits (which may be configured as either CRC bits or spare bits), one or more fields of WrCnt bits (e.g., a counter bit), and one or more (e.g., two) fields of poison bits (e.g., bits indicating invalidity of a portion of the code word). Format 305 may include one or more (e.g., three) fields of CwCon bits, one or more (e.g., two) fields of XORSub/Spare bits (which may be configured as either XORSub bits or spare bits), and one or more (e.g., three) fields of XORSub bits.

The code word format 300 may also illustrate user data field of 1,024 bits (e.g., channels 310-a through 310-h over the second data burst 320-2 through the 16th data burst 320-16, and channels 310-i and 310-j over the second data burst 320-2 through the fifth data burst 320-5), CwECC fields (e.g., channels 310-i and 310-j over the 6th data burst 320-6 through the 16th data burst 320-16), and XOR/Sub fields (e.g., channel 310-k over the second data burst 320-2 through the 16th data burst 320-16).

As an example of a code word format that supports a low-latency operation, a subset of bit fields corresponding to the first data burst (e.g., the data burst 320-1) may be configured as illustrated in the format 306. In the format 306, each group of 8-bits of channel 310-a (e.g., A7 . . . A0) and channel 310-b (e.g., B7 . . . B0) may be configured to have the format 301. Also, a group of 8-bits of channel 310-c (e.g., C7 . . . C0) may be configured to have the format 302. At least some, if not each, group of 8-bits of channel 310-d (e.g., D7 . . . D0) through channel 310-i (e.g., I7 . . . I0) may be configured to have the format 303. A group of 8-bits of channel 310-j (e.g., J7 . . . J0) may be configured to have the format 304. Further, a group of 8-bits of channel 310-k (e.g., K7 . . . K0) may be configured to have the format 305.

As a result of configuring the subset of bit fields (e.g., a total of 88 bits including eight (8) bits from each channel of eleven (11) channels) corresponding to the first data burst (e.g., the first data burst 320-1) of the code word format 300, the first data burst of 88 bits (e.g., the 88 bits of the format 306) may include information to facilitate a low-latency, reliable transaction of an access operation associated with the code word (e.g., reading 1,024 bits of user data). In some cases, a port manager (e.g., a port manager 260-a) may receive a first portion of a code word (e.g., the bits of the format 306 corresponding to the first data burst 320-1) associated with a memory medium. The port manager may parse (e.g., interpret) the first portion of the code word (e.g., identifying spare bits) concurrently with receiving additional portions of the code word (e.g., the bits of the code word format 300 corresponding to a second data burst 320-2, and so on) during subsequent data bursts. As such, the port manager may parallelize various operations associated with the code word to supply reliable, low-latency communication or information exchange with a host.

When a code word becomes unreliable or nearly unreliable, a controller (e.g., a controller 120 or a port manager 260-a described with reference to FIGS. 1 and 2) may configure the code word as a forwarded code word. In contrast to a code word format that includes user data (e.g., the code word format 300), a forwarded code word format (which may also be referred to as a forwarded code word layout) may include a quantity of duplicates of a forwarding address (e.g., a replacement address) to facilitate access of the user data. Additionally, in some cases, a forwarded code word format may include a quantity of bit fields indicating a code word condition (e.g., one or more CwCon bits). The forwarded code word format may also support a low latency operation, which, in turn, may include determining a code word as a forwarded code word and identifying a forwarding address from the forwarded code word.

In some cases, the controller may determine to configure a code word as a forwarded code word without waiting for the code word (e.g., user data therein) to become unrecoverable beyond an error recovery capability of the memory system or subsystem. As a code word may include information related to an error control operation (e.g., one or more CRC bits, one or more CwECC bits), the controller may in some cases determine a quantity of erroneous bits (e.g., faulty bits) in the code word based on performing the error control operation on the code word during an access operation (e.g., read operation). The controller may determine the quantity of erroneous bits relative to (e.g., exceeding, being equal to, approaching) an error threshold (e.g., an error threshold from which the code word may become unreliable or invalid). In some cases, the error threshold may be related to a tolerable limit of a quantity of erroneous bits in a code word (e.g., a quantity of erroneous bits that the code word is preconfigured to recover).

The controller may configure the code word as a forwarded code word in accordance with a forwarded code word format based on determining the quantity of erroneous bits in the code word. In some cases, the error threshold may be configurable based on a quantity of factors (e.g., a memory technology used to fabricate a memory device of a memory medium, a maturity of such memory technology, a memory medium usage pattern). The controller may also set one or more CwCon bits to indicate that the code word is a forwarded code word.

Figure 4:
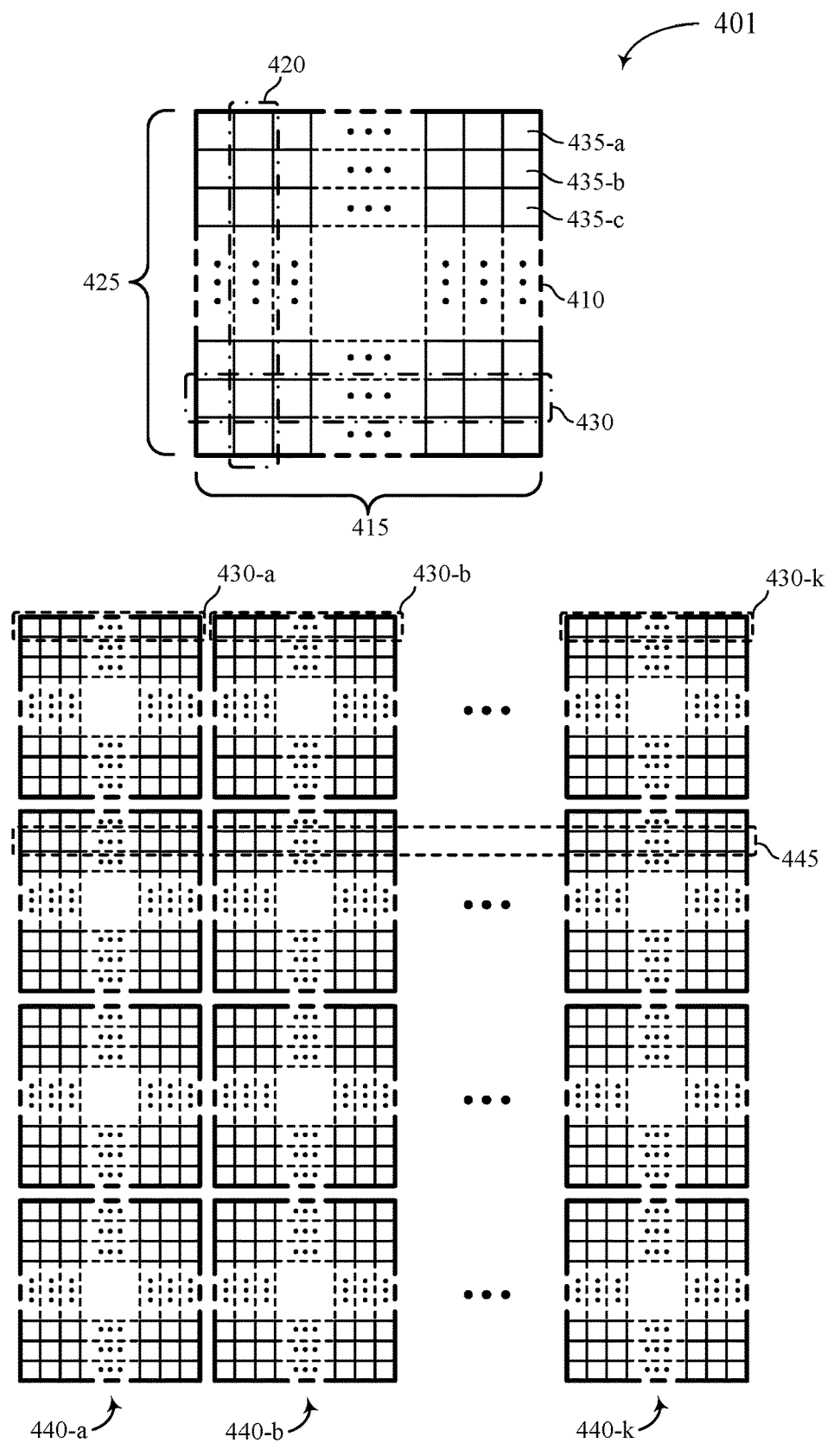
FIG. 4 illustrates examples of a configuration of a memory die and a configuration of a memory medium that support media scrubber operations in a memory system in accordance with aspects disclosed herein.

FIG. 4 illustrates examples of a configuration 401 of a memory array and a configuration 402 of a memory medium that support media scrubber operations in a memory system in accordance with aspects disclosed herein. The memory array depicted in the configuration 401 may be an example of a memory die in a memory medium (e.g., memory medium 130 or memory medium 295) described with reference to FIGS. 1 and 2. The memory medium depicted in the configuration 402 may be an example of a memory medium (e.g., memory medium 130 or memory medium 295) described with reference to FIGS. 1 and 2. The memory medium depicted in the configuration 402 may include a quantity of memory arrays (e.g., forty-four (44) memory arrays) that each may be configured according to the configuration 401.

The configuration 401 may include a memory array 410. In some cases, the memory array 410 may include a set of memory cells (e.g., 512 Giga-bits of memory cells, $2^{39}$ memory cells). The memory array 410 may be organized to have an array width 415 and an array depth 425. In some cases, the array width 415 may be referred to as a die width 415 and the array depth 425 may be referred to as a die depth 425. Further, the array width 415 and the array depth 425, each may be divided into a quantity of partitions. In some cases, the array width 415 may be divided into 128 sections. Hence, a section 420 depicted in the configuration 401 may represent one of 128 sections in the array width 415. Further, each section (e.g., the section 420) may be divided into 128 pieces such that the array depth 425 may be divided into 128 sticks. A stick may be referred to as a section, subsection, part, element, etc. Hence, a stick 430 depicted in the configuration 401 may represent one of 128 sticks in the array depth 425.

As such, the memory array 410 (e.g., 512 Giga-bits of memory cells) may be divided into a quantity of segments 435 (e.g., a segment 435-a, 435-b, or 435-c) that are each depicted as a box inside of the memory array 410 as one example. The memory array 410 may include 16,384 segments as a result of dividing the array width 415 into 128 sections that each are further divided into 128 sticks (e.g., sections, subsections, parts, elements) in the array depth 425, in this example. Each segment 435 of the memory array 410 may be referred to as an MSR 435. In some cases, an MSR 435 may include a group of memory cells (e.g., $2^{25}$ memory cells) that may be configured as a unit of data associated with an error control operation. An MSR may be configured as a reasonable fault containment zone to efficiently manage (e.g., replace, substitute) erroneous bits in the memory array 410.

A quantity of sections (e.g., 128 sections) in the array width 415 may be determined based on a manner of constructing a memory array (e.g., the memory array 410) in a memory die. For example, the memory array 410 may have a quantity of tiles (e.g., 128 tiles) and the quantity of sections in the array width 415 may be based on the quantity of tiles of the memory array 410. Similarly, a quantity of sticks (e.g., 128 sticks) in the array depth 425 may be determined based on common features associated with various functional components, such as row decoders, column decoder, among others. As a result of dividing the memory array 410 as depicted in the configuration 401, each segment 435 (e.g., an MSR including $2^{25}$ memory cells out of 16,384 MSRs in the memory array 410 including 512 Giga-bits) may provide a group of memory cells (e.g., a unit of data) to efficiently manage (e.g., replace, substitute) erroneous bits in the memory array 410 without incurring a significant overhead. In some cases, a size of the unit of memory cells (e.g., $2^{25}$ memory cells of an MSR) may be referred to as a granularity of data to support efficient error control operations associated with a memory medium.

Still referring to the configuration 401, a stick 430 across a quantity of sections (e.g., 128 sections) may represent a first quantity of bits (e.g., 128 bits) produced by the memory array 410 as part of a code word (e.g., part of a code word including 1,408 bits). The first quantity of bits (e.g., 128 bits) of the stick 430 may be further multiplexed down to a set of a second quantity of bits (e.g., eight (8) bits), where each set of the second quantity of bits (e.g., eight (8) bits) may be produced at a given data burst (e.g., one of sixteen (16) data bursts that produce a total of 128 bits). As such, the stick 430 may produce a part of a code word, in which each segment 435 (e.g., MSR 435) contributes one bit of the first quantity of bits (e.g., 128 bits) of the code word. Further, the stick 430 (e.g., 128 bits produced over 16 data bursts) may correspond to a channel (e.g., channel 291-a described with reference to FIG. 2). A complete code word (e.g., a code word of 1,408 bits) may be produced when a quantity of memory arrays 410 (e.g., eleven (11) memory arrays 410) operate in parallel such that each memory array 410 may produce part of bits constituting the complete code word—e.g., each memory array 410 producing 128 bits over sixteen (16) data bursts across eleven (11) channels amounting to a total of 1,408 bits of a code word.

The configuration 402 may include a set of memory arrays 410 (e.g., forty-four (44) memory arrays 410) to achieve a desirable or specified capacity of a memory medium (e.g., a memory medium 130 or a memory medium 295 described with reference to FIGS. 1 and 2). The set of memory arrays in the memory medium may be arranged to form a plurality of channels for the memory medium. In some cases, the memory medium may include eleven (11) channels (e.g., channels 440-a through 440-k) as illustrated in the configuration 402. Each channel 440 may be an example or include aspects of the channel 291 (e.g., channels 291-a through 291-k) described with reference to FIG. 2. Further, each channel 440 may be configured to include a subset of the memory arrays. In some cases, a channel (e.g., channel 440-a) may include four (4) memory arrays 410-a through 410-d. As such, each channel of the plurality may, in some cases, include a total quantity of sticks 430 (e.g., 512 sticks) that correspond to a multiple of a quantity of sticks of a memory array 410 (e.g., 128 sticks) times a quantity of memory arrays 410 (e.g., four (4) memory arrays) within the channel.

In some cases, a group of MSRs across a plurality of channels (e.g., eleven (11) channels, i.e., channels 440-a through 440-k) that produces a code word may be referred to as an MSR strip (e.g., an MSR strip 445 depicted in the configuration 402). An MSR strip may also be referred to as an MSR region. For example, the memory medium of the configuration 402 includes 512 MSR strips (e.g., 512 MSR regions). Also, an MSR strip (e.g., an MSR strip 445) may correspond to a collective array depth (e.g., a collective die depth) of a memory medium—e.g., an MSR strip 445 depicted in the configuration 402 may correspond to the 130th array depth (e.g., the 130th MSR strip out of a total array depth of 512 MSR strips) of the memory medium, in which each memory array 410 includes 128 MSR strips. In some cases, a flag may be associated with an MSR strip (or an MSR region) to indicate a change in spare bit assignments associated with a code word retained at the MSR strip (e.g., MSR strip 345 or the MSR region 345). The flag may be part of a separate memory array (e.g., SRAM memory cells), which may be integrated in a controller (e.g., a controller 120 or a port manager 260-a described with reference to FIGS. 1 and 2) in some cases.

At least some, if not each, MSRs (e.g., MSR 435-a, MSR 435-b, MSR 435-c) of a memory array (e.g., memory array 410) may be associated with a counter configured to count a quantity of erroneous bits therein. For example, a port manager (e.g., a port manager 260-a described with reference to FIG. 2) may, as part of a background operation (e.g., a media scrubber operation), read a code word from an MSR strip (e.g., the MSR strip 445) and perform an error control operation for the code word. The port manager may identify a quantity of erroneous bits and correct the quantity of erroneous bits in the code word using a set of bits in the code word (e.g., bits supporting an error correction function). Each erroneous bit of the quantity (e.g., a faulty or unreliable memory cell) may correspond to a respective MSR of the MSR strip. The port manager may update a first counter associated with the first MSR of the MSR strip to count a quantity of erroneous bits (e.g., erroneous bit counts) in the first MSR of the MSR strip.

The port manager may sort values (e.g., erroneous bit counts) saved in the counters for a code word (e.g., 1,408 counters that each correspond to 1,408 MSRs) to identify a subset of the values that is greater than remaining values. For example, the port manager may sort the values (e.g., erroneous bit counts) in descending order to identify a subset of the values (e.g., 160 highest erroneous bit counts out of 1,408 erroneous bits counts associated with a code word). In this manner, the port manager may identify a subset of MSRs that each include higher quantities of erroneous bits compared to other MSRs. The port manager may identify the subset of MSRs (e.g., 160 MSRs out of 1,408 MSRs) as candidates for a replacement (e.g., substituting such MSRs with MSRs that are reliable, e.g., spare MSRs). In some cases, the port manager may configure a quantity of values of the subset (e.g., 200 highest erroneous bit counts instead of 160 highest erroneous bit counts) based on a quantity of erroneous bits identified in a code word. Such a quantity of values of the subset (e.g., a subset of MSRs identified as candidates for replacement) may be based on various factors (e.g., a memory technology used to fabricate a memory device of a memory medium, a maturity of such memory technology, a memory medium usage pattern) in some cases.

Further, the port manager may replace one or more MSRs (e.g., a subset of MSRs identified as candidates for replacement) having higher erroneous bit counts with a set of spare MSRs until the set of spare MSRs is exhausted. The port manager may determine to replace an MSR based on a quantity of erroneous bits (e.g., erroneous bit counts) in the MSR relative to a threshold (e.g., a bit-level replacement threshold). In some cases, the port manager may determine to replace an MSR having erroneous bit counts equal to or greater than the threshold with a spare MSR. The threshold may be based on a raw bit error rate (RBER) associated with a memory medium. In some cases, the threshold may be based on a size of an MSR (e.g., $2^{25}$ bits in an MSR). In some cases, the threshold may be configurable (e.g., programmable) to account for a maturity of technology used for fabricating memory cells of a memory medium, process variations that may affect electrical characteristics of memory cells of a memory medium, for example.

The port manager may assign a spare MSR (e.g., a spare bit in a code word) to replace any one of the MSRs identified as candidates for replacement (e.g., an erroneous bit in a code word). In some cases, spare bits (e.g., spare MSRs) may be assigned on a first recognized, first assigned basis. The port manager may repeat assigning spare bits to erroneous bits in a code word until all the spare bits (e.g., up to twenty-two (22) spare bits as described with reference to FIG. 3) are assigned. In some cases, a spare bit (e.g., a spare MSR) may be re-assigned to a different erroneous bit (e.g., a different MSR including a quantity of erroneous bits that is equal to or greater than the bit-level threshold). In other cases, each spare bit may remain assigned to a respective erroneous bit in a code word once the spare bit has been assigned to the respective erroneous bit.

The port manager may, as part of a media scrubber operation (e.g., during a first media scrubbing period for an MSR strip) in some cases, assign one or more spare bits (e.g., one or more MSRs corresponding to the spare bits) in a code word to replace erroneous bits (e.g., MSRs corresponding to the erroneous bits) in the code word (e.g., one of the code words retained at the MSR strip). The port manager may set a bit (e.g., a flag) in the separate memory array to indicate such a change in the substitution relationship associated with the code word retained at the MSR strip. Setting the bit (e.g., the flag) may also indicate that a spare bit may not include a valid logic state for the code word although the substitution relationship for the spare bit may have been determined.

The port manager may save a substitutional relationship (e.g., spare bit assignments to respective erroneous bits) for the code word retained at the memory medium (e.g., an MSR strip) in the separate memory array. In some cases, the memory array may be integrated as part of the port manager. In some cases, the separate memory array may include static random access memory (SRAM) cells.

A size of the memory array (e.g., a quantity of SRAM cells) allocated for saving the substitutional relationship may be based on a bit indicating a change in the substitution relationship (e.g., a flag indicating a change in spare assignments), an identification of a channel associated with the code word (e.g., an identification of a channel to be replaced), a quantity of spare bits in the code word (e.g., up to twenty-two (22) spare bits), an identification of an MSR of a first quantity of MSRs associated with the code word (e.g., 1,408 MSRs), a quantity of bits associated with forwarded code words in the memory medium, an error correction capability for the substitution relationship, a quantity of memory dice corresponding to a channel associated with the code word (e.g., four (4) memory dice per a channel), or a second quantity of MSR groups in a memory die of the quantity (e.g., 128 MSR sticks), or any combination thereof.

The port manager may, as part of a media scrubber operation (e.g., during a second media scrubbing period for the MSR strip) in some cases, access the code word, replace the erroneous bits with the one or more spare bits according to the substitution relationship saved in the memory array (e.g., SRAM cells), and perform an error control operation to restore logic states for the code word (e.g., the code word including the one or more spare bits that substituted the erroneous bits). The port manager may write the restored logic states (e.g., valid logic states) at the one or more spare bits and may reset the bit (e.g., the flag) in the memory array (e.g., SRAM cells). In this manner, the one or more spare bits may include valid logic states for the code word and the bit (e.g., the flag) may indicate that the one or more spare bits in the code word include valid logic states to be implemented (e.g., multiplexed with a series of data burst into a bit stream of the code word) when a host requests the code word.

In some cases, the port manager may receive a code word retained at a portion of a memory medium, the code word including a plurality of bits that include a quantity of spare bits for the code word. The port manager may also access a memory array of a port manager based on receiving the code word. In some cases, the port manager may perform an error control operation on the code word to restore logic states of the plurality of bits based on accessing the memory array of the port manager. The port manager may also write a logic state of a bit of the plurality at a spare bit of the quantity based on performing the error control operation. In some cases, receiving the code word may include retrieving each code word of a plurality of code words retained at the portion of the memory medium as part of a periodic background operation independent of an access command from a host.

In some cases, the port manager may substitute a bit of the plurality with a spare bit of the quantity based on accessing the memory array, where performing the error control operation on the code word may be based on substituting the bit of the plurality. The port manager may also identify a value of a flag in the memory array based on accessing the memory array, the value of the flag indicating a change in a substitution relationship for the code word retained at the portion of the memory medium, where performing the error control operation on the code word may be based on identifying the value of the flag. In some cases, the port manager may reset a value of a flag in the memory array based on writing the logic state of the bit of the plurality, the value of the flag indicating that the spare bit of the quantity includes the logic state that is valid for substituting the bit of the plurality.

In some cases, the port manager may receive an indication of a power level from a power management component coupled with the port manager and transfer the information (e.g., an indication of error status associated with a code word, one or more indications of spare bit assignments to erroneous bits) saved in the memory array (e.g., SRAM cells) to a non-volatile memory (e.g., a persistent memory) as described with reference to FIGS. 1 and 2.

Figure 5:
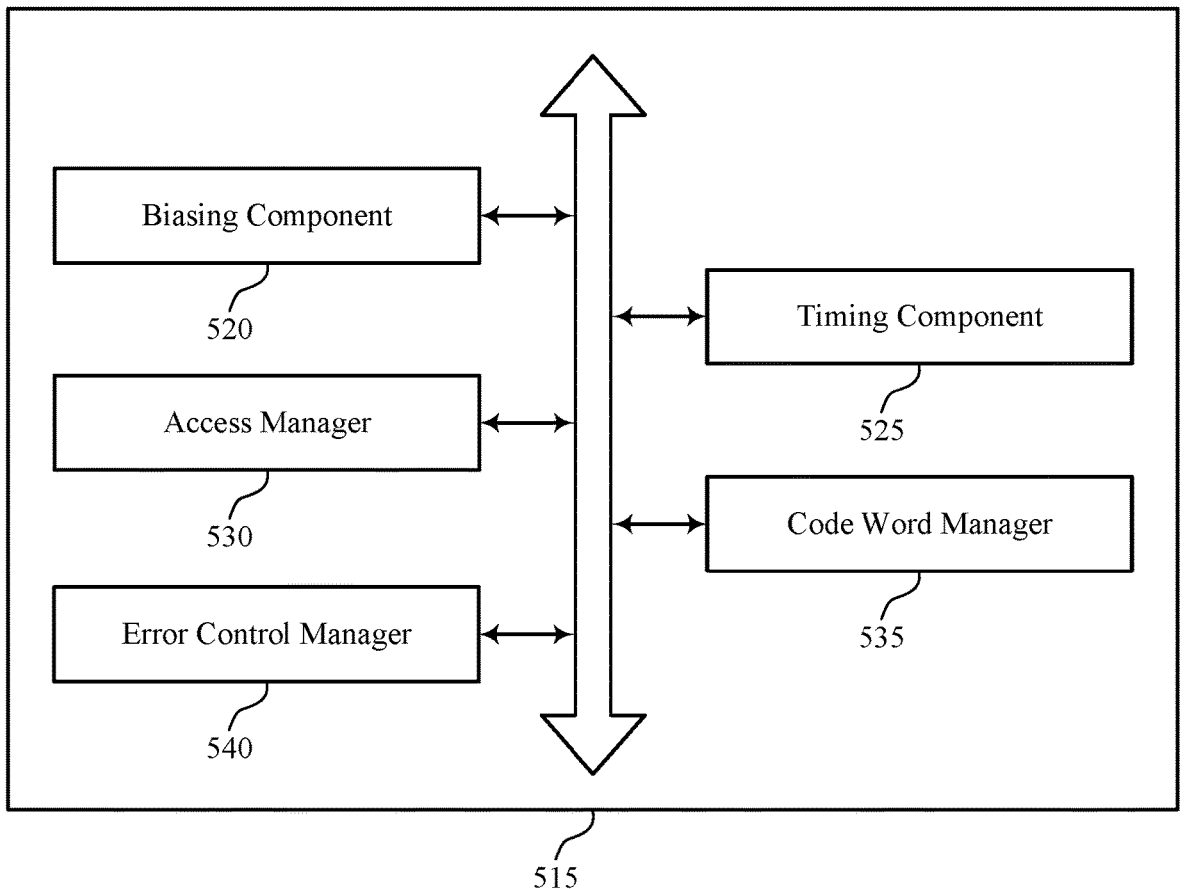
FIG. 5 shows a block diagram of a device that supports media scrubber operations in a memory system in accordance with aspects disclosed herein.

FIG. 5 shows a block diagram 500 of a controller 515 that supports media scrubber operations in a memory system in accordance with aspects disclosed herein. The controller 515 may be an example of aspects of the controller 120 or the controller 230 described with reference to FIGS. 1 through 2. The controller 515 may include a biasing component 520, a timing component 525, an access manager 530, a code word manager 535, and an error control manager 540. Each of these modules may communicate, directly or indirectly, with one another (e.g., via one or more buses).

The access manager 530 may receive a first code word from a memory medium based on setting a value of a second counter. In some cases, the access manager 530 may receive a second code word from the memory medium based on updating a value of a first counter. In some cases, the access manager 530 may write the first code word back to the memory medium based on configuring the first code word as a forwarded code word. In some cases, receiving the first code word may further includes retrieving the first code word as part of a periodic background operation independent of an access command from a host.

In some cases, the access manager 530 may receive a code word retained at a portion of a memory medium, the code word including a plurality of bits that include a quantity of spare bits for the code word. In some cases, the access manager 530 may write a logic state of a bit of the plurality at a spare bit of a quantity based on performing an error control operation. In some cases, receiving the code word may further include retrieving each code word of a plurality of code words retained at the portion of the memory medium as part of a periodic background operation independent of an access command from a host, where accessing the memory array may be based on retrieving each code word of the plurality.

In some cases, the access manager 530 may receive a code word from an address of a memory medium, the code word including a set of bits. In some cases, the access manager 530 may write the code word back to the address of the memory medium based on setting the value of the bit indicating the inversion status.

The code word manager 535 may identify a value of a first counter associated with a memory medium, the first counter indicating a first quantity of code words retained at the memory medium during a first duration, the first quantity of code words configured as forwarded code words. In some cases, the code word manager 535 may set a value of a second counter associated with the memory medium based on identifying the value of the first counter, the second counter indicating a second quantity of code words retained at the memory medium during a second duration, the second quantity of code words configured as forwarded code words. In some cases, the code word manager 535 may configure the first code word as a forwarded code word based on the determination.

In some cases, the code word manager 535 may update the value of the first counter based on configuring the first code word as a forwarded code word. In some cases, the code word manager 535 may determine the updated value of the first counter relative to a first threshold that is associated with a quantity of forwarded code words retained at the memory medium. In some cases, the code word manager 535 may refrain from configuring the second code word as a forwarded code word based on the updated value of the first counter relative to the first threshold. In some cases, the code word manager 535 may determine that the first code word corresponds to a last code word retained at the memory medium. In some cases, the code word manager 535 may update the value of the second counter based on updating the value of the first counter and determining that the first code word corresponds to the last code word retained at the memory medium.

In some cases, the code word manager 535 may determine the updated value of the second counter relative to a second threshold associated with the quantity of forwarded code words retained at the memory medium. In some cases, the code word manager 535 may refrain from configuring a code word as a forwarded code word based on the updated value of the second counter. In some cases, the code word manager 535 may reset the value of the first counter based on setting the value of the second counter, where receiving the first code word may be based on resetting the value of the first counter. In some cases, the first duration may be based on a preconfigured period of retrieving a set of code words from the memory medium. In some cases, the second duration may be based on a lifetime of the memory medium, and where the lifetime of the memory medium may be based on an estimated duration within the which the memory medium satisfies a set of operating criteria. In some cases, a forwarded code word may include a quantity of duplicates of a forwarding address for the first code word.

In some cases, the code word manager 535 may invert a portion of a set of bits based on receiving a code word, where the code word may include the set of bits. In some cases, the code word manager 535 may set a value of a bit of the set to indicate a code word condition including an inversion status of the code word based on inverting the portion of the bits. In some cases, the portion of the bits may include every bit of the set of bits.

The error control manager 540 may determine that a first code word satisfies a condition for configuring the first code word as a forwarded code word, the condition being based on a quantity of erroneous bits in the first code word. In some cases, the error control manager 540 may determine that a second code word satisfies the condition for configuring the second code word as a forwarded code word based on receiving the second code word.

In some cases, the error control manager 540 may access a memory array of a port manager based on receiving a code word. In some cases, the error control manager 540 may perform an error control operation on the code word to restore logic states of a plurality of bits of the code word based on accessing the memory array of the port manager. In some cases, the error control manager 540 may substitute a bit of the plurality with a spare bit of the quantity based on accessing the memory array, where performing the error control operation on the code word may be based on substituting the bit of the plurality. In some cases, the error control manager 540 may identifying a value of a flag in the memory array based on accessing the memory array, the value of the flag indicating a change in a substitution relationship for the code word retained at the portion of the memory medium, where performing the error control operation on the code word may be based on identifying the value of the flag.

In some cases, the error control manager 540 may reset a value of a flag in the memory array based on writing the logic state of the bit of the plurality, the value of the flag indicating that the spare bit of the quantity includes the logic state that is valid for substituting the bit of the plurality. In some cases, a size of the memory array for saving a substitution relationship for the code word retained at the portion of the memory medium may be based on a bit indicating a change in a substitution relationship, an identification of a channel associated with the code word, the quantity of spare bits in the code word, an identification of a Minimum Substitution Region (MSR) of a first quantity of MSRs associated with the code word, a quantity of bits associated with forwarded code words in the memory medium, an error correction capability for the substitution relationship, a quantity of memory dice corresponding to a channel associated with the code word, or a second quantity of MSR groups in a memory die of the quantity, or any combination thereof.

Figure 6:
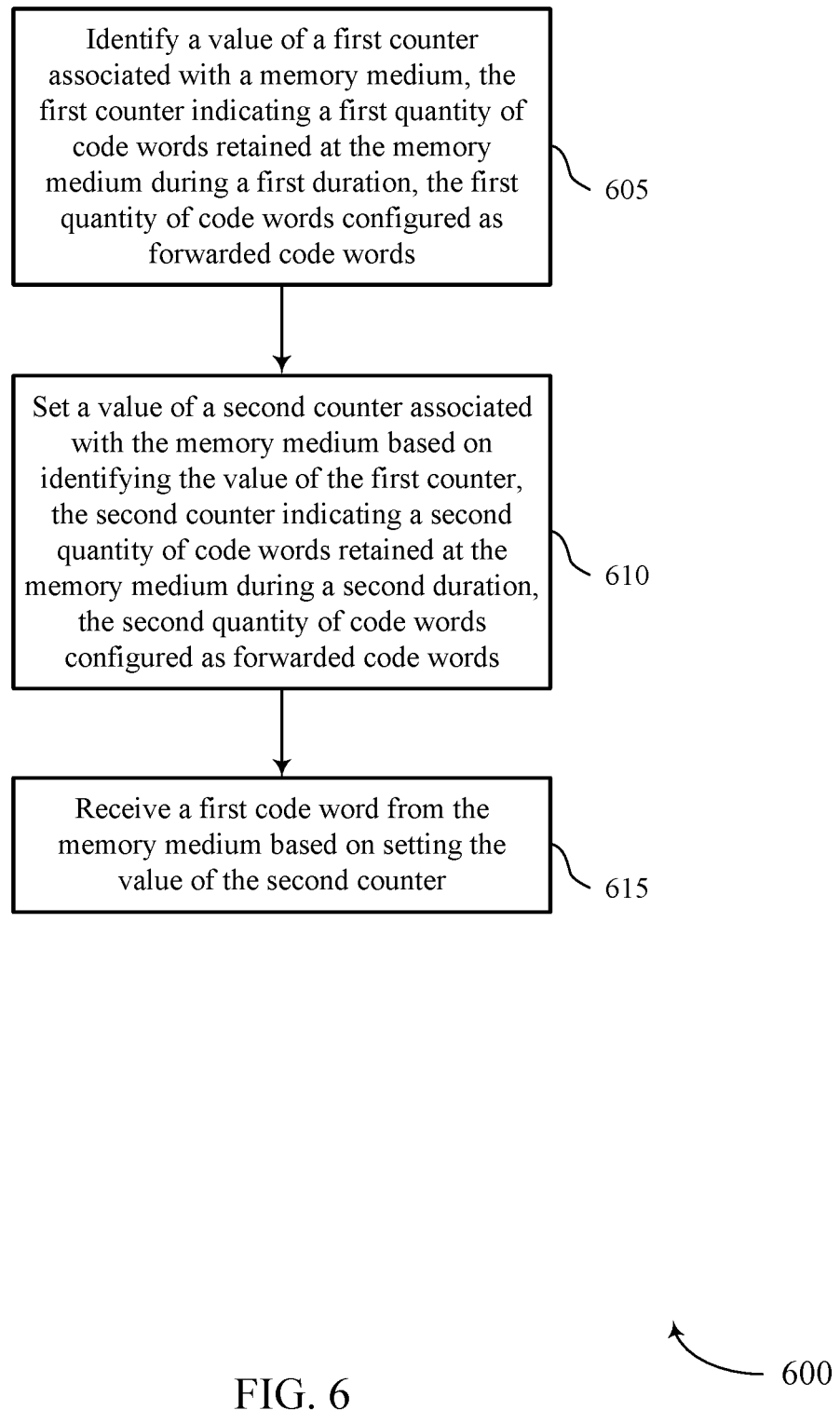
FIGS. 6 through 8 illustrate a method or methods supporting media scrubber operations in a memory system in accordance with aspects disclosed herein.

FIG. 6 shows a flowchart illustrating a method 600 that supports media scrubber operations in a memory system in accordance with aspects disclosed herein. The operations of method 600 may be implemented by a controller or its components as described with reference to FIGS. 1 through 2. For example, the operations of method 600 may be performed by the controller 120 or the controller 230 described with reference to FIGS. 1 through 2. In some examples, a controller 230 may execute a set of codes to control the functional elements of the device to perform the functions described below. Additionally or alternatively, the controller 230 may perform aspects of the functions described below using special-purpose hardware.

At 605 the controller 230 may identify a value of a first counter associated with a memory medium, the first counter indicating a first quantity of code words retained at the memory medium during a first duration, the first quantity of code words configured as forwarded code words. The operations of 605 may be performed according to the methods described with reference to FIGS. 1-5. In certain examples, aspects of the operations of 605 may be performed by a code word manager as described with reference to FIG. 5.

At 610 the controller 230 may set a value of a second counter associated with the memory medium based on identifying the value of the first counter, the second counter indicating a second quantity of code words retained at the memory medium during a second duration, the second quantity of code words configured as forwarded code words. The operations of 610 may be performed according to the methods described with reference to FIGS. 1-5. In certain examples, aspects of the operations of 610 may be performed by a code word manager as described with reference to FIG. 5.

At 615 the controller 230 may receive a first code word from the memory medium based on setting the value of the second counter. The operations of 615 may be performed according to the methods described with reference to FIGS. 1-5. In certain examples, aspects of the operations of 615 may be performed by an access manager as described with reference to FIG. 5.

An apparatus for performing a method or methods, such as the method 600, is described. The apparatus may include means for identifying a value of a first counter associated with a memory medium, the first counter indicating a first quantity of code words retained at the memory medium during a first duration, the first quantity of code words configured as forwarded code words, means for setting a value of a second counter associated with the memory medium based on identifying the value of the first counter, the second counter indicating a second quantity of code words retained at the memory medium during a second duration, the second quantity of code words configured as forwarded code words, and means for receiving a first code word from the memory medium based on setting the value of the second counter.

Another apparatus for performing a method or methods, such as the method 600, is described. The apparatus may include a memory medium and a controller in electronic communication with the memory medium, where the controller may be operable to identify a value of a first counter associated with a memory medium, the first counter indicating a first quantity of code words retained at the memory medium during a first duration, the first quantity of code words configured as forwarded code words, set a value of a second counter associated with the memory medium based on identifying the value of the first counter, the second counter indicating a second quantity of code words retained at the memory medium during a second duration, the second quantity of code words configured as forwarded code words, and receive a first code word from the memory medium based on setting the value of the second counter.

Some examples of the method 600 and apparatuses described herein may further include processes, features, means, or instructions for determining that the first code word satisfies a condition for configuring the first code word as a forwarded code word, the condition being based on a quantity of erroneous bits in the first code word. Some examples of the method 600 and apparatuses described herein may further include processes, features, means, or instructions for configuring the first code word as a forwarded code word based on the determination. Some examples of the method 600 and apparatuses described herein may further include processes, features, means, or instructions for updating the value of the first counter based on configuring the first code word as a forwarded code word. Some examples of the method 600 and apparatuses described herein may further include processes, features, means, or instructions for determining the updated value of the first counter relative to a first threshold that is associated with a quantity of forwarded code words retained at the memory medium.

Some examples of the method 600 and apparatuses described herein may further include processes, features, means, or instructions for receiving a second code word from the memory medium based on updating the value of the first counter. Some examples of the method 600 and apparatuses described herein may further include processes, features, means, or instructions for determining that the second code word satisfies the condition for configuring the second code word as a forwarded code word based on receiving the second code word. Some examples of the method 600 and apparatuses described herein may further include processes, features, means, or instructions for refraining from configuring the second code word as a forwarded code word based on the updated value of the first counter relative to the first threshold.

Some examples of the method 600 and apparatuses described herein may further include processes, features, means, or instructions for determining that the first code word corresponds to a last code word retained at the memory medium. Some examples of the method 600 and apparatuses described herein may further include processes, features, means, or instructions for updating the value of the second counter based on updating the value of the first counter and determining that the first code word corresponds to the last code word retained at the memory medium. Some examples of the method 600 and apparatuses described herein may further include processes, features, means, or instructions for determining the updated value of the second counter relative to a second threshold associated with the quantity of forwarded code words retained at the memory medium. Some examples of the method 600 and apparatuses described herein may further include processes, features, means, or instructions for refraining from configuring a code word as a forwarded code word based on the updated value of the second counter.

Some examples of the method 600 and apparatuses described herein may further include processes, features, means, or instructions for writing the first code word back to the memory medium based on configuring the first code word as a forwarded code word. Some examples of the method 600 and apparatuses described herein may further include processes, features, means, or instructions for resetting the value of the first counter based on setting the value of the second counter, where receiving the first code word may be based on resetting the value of the first counter. In some examples of the method 600 and apparatuses described herein, the first duration may be based on a preconfigured period of retrieving a set of code words from the memory medium. In some examples of the method 600 and apparatuses described herein, the second duration may be based on a lifetime of the memory medium, and where the lifetime of the memory medium may be based on an estimated duration within the which the memory medium satisfies a set of operating criteria.

In some examples of the method 600 and apparatuses described herein, receiving the first code word may further include retrieving the first code word as part of a periodic background operation independent of an access command from a host. In some examples of the method 600 and apparatuses described herein, a forwarded code word may include a quantity of duplicates of a forwarding address for the first code word.

Figure 7:
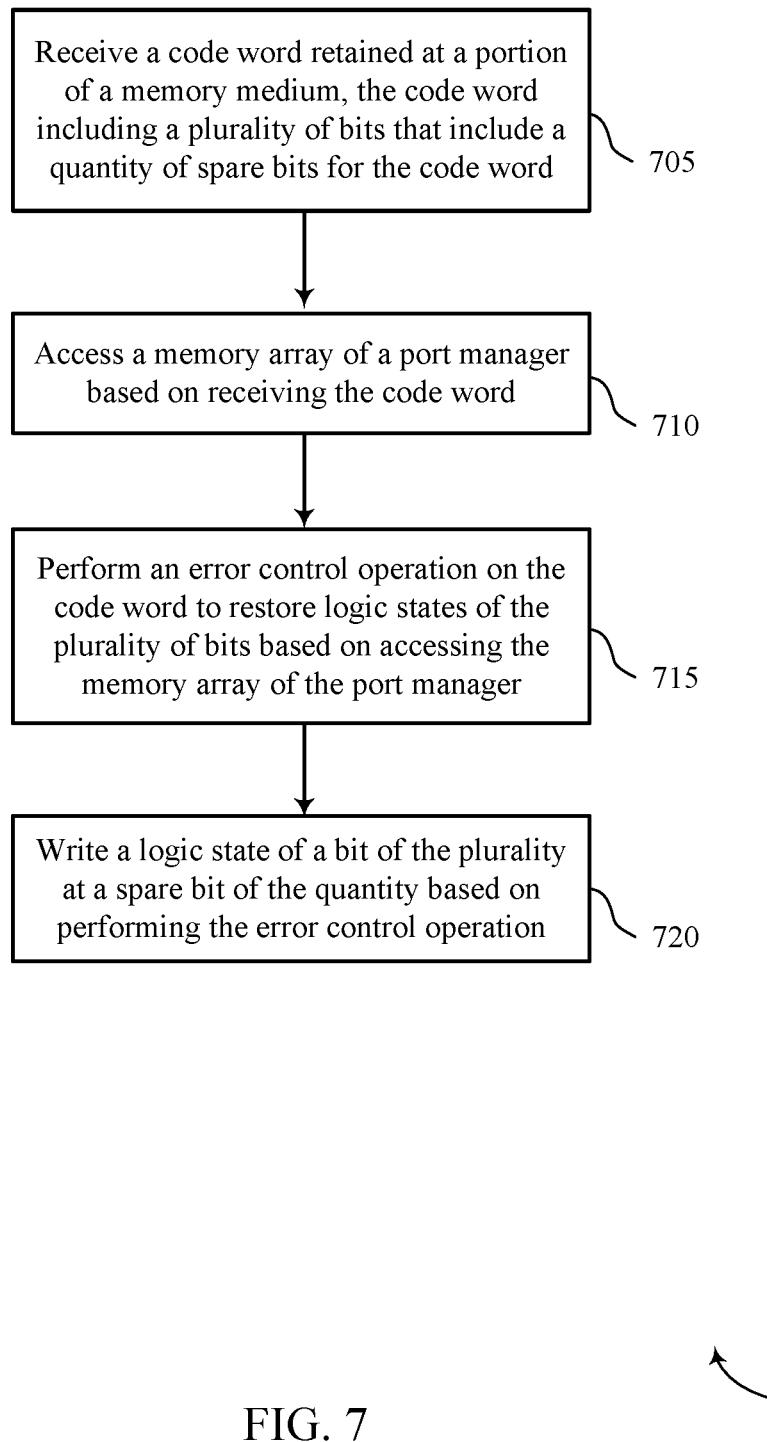

FIG. 7 shows a flowchart illustrating a method 700 that supports media scrubber operations in a memory system in accordance with aspects disclosed herein. The operations of method 700 may be implemented by a controller or its components as described with reference to FIGS. 1 through 2. For example, the operations of method 700 may be performed by the controller 120 or the controller 230 described with reference to FIGS. 1 through 2. In some examples, a controller 230 may execute a set of codes to control the functional elements of the device to perform the functions described below. Additionally or alternatively, the controller 230 may perform aspects of the functions described below using special-purpose hardware.

At 705 the controller 230 may receive a code word retained at a portion of a memory medium, the code word including a plurality of bits that include a quantity of spare bits for the code word. The operations of 705 may be performed according to the methods described with reference to FIGS. 1-5. In certain examples, aspects of the operations of 705 may be performed by an access manager as described with reference to FIG. 5.

At 710 the controller 230 may access a memory array of a port manager based on receiving the code word. The operations of 710 may be performed according to the methods described with reference to FIGS. 1-5. In certain examples, aspects of the operations of 710 may be performed by an error control manager as described with reference to FIG. 5.

At 715 the controller 230 may perform an error control operation on the code word to restore logic states of the plurality of bits based on accessing the memory array of the port manager. The operations of 715 may be performed according to the methods described with reference to FIGS. 1-5. In certain examples, aspects of the operations of 715 may be performed by an error control manager as described with reference to FIG. 5.

At 720 the controller 230 may write a logic state of a bit of the plurality at a spare bit of the quantity based on performing the error control operation. The operations of 720 may be performed according to the methods described with reference to FIGS. 1-5. In certain examples, aspects of the operations of 720 may be performed by an access manager as described with reference to FIG. 5.

An apparatus for performing a method or methods, such as the method 700, is described. The apparatus may include means for receiving a code word retained at a portion of a memory medium, the code word including a plurality of bits that include a quantity of spare bits for the code word, means for accessing a memory array of a port manager based on receiving the code word, means for performing an error control operation on the code word to restore logic states of the plurality of bits based on accessing the memory array of the port manager, and means for writing a logic state of a bit of the plurality at a spare bit of the quantity based on performing the error control operation.

Another apparatus for performing a method or methods, such as the method 700, is described. The apparatus may include a memory medium and a controller in electronic communication with the memory medium, where the controller may be operable to receive a code word retained at a portion of a memory medium, the code word including a plurality of bits that include a quantity of spare bits for the code word, access a memory array of a port manager based on receiving the code word, perform an error control operation on the code word to restore logic states of the plurality of bits based on accessing the memory array of the port manager, and write a logic state of a bit of the plurality at a spare bit of the quantity based on performing the error control operation.

Some examples of the method 700 and apparatuses described herein may further include processes, features, means, or instructions for substituting a bit of the plurality with a spare bit of the quantity based on accessing the memory array, where performing the error control operation on the code word may be based on substituting the bit of the plurality.

Some examples of the method 700 and apparatuses described herein may further include processes, features, means, or instructions for identifying a value of a flag in the memory array based on accessing the memory array, the value of the flag indicating a change in a substitution relationship for the code word retained at the portion of the memory medium, where performing the error control operation on the code word may be based on identifying the value of the flag. Some examples of the method 700 and apparatuses described herein may further include processes, features, means, or instructions for resetting a value of a flag in the memory array based on writing the logic state of the bit of the plurality, the value of the flag indicating that the spare bit of the quantity includes the logic state that is valid for substituting the bit of the plurality.

In some examples of the method 700 and apparatuses described herein, a size of the memory array for saving a substitution relationship for the code word retained at the portion of the memory medium may be based on a bit indicating a change in a substitution relationship, an identification of a channel associated with the code word, the quantity of spare bits in the code word, an identification of a Minimum Substitution Region (MSR) of a first quantity of MSRs associated with the code word, a quantity of bits associated with forwarded code words in the memory medium, an error correction capability for the substitution relationship, a quantity of memory dice corresponding to a channel associated with the code word, or a second quantity of MSR groups in a memory die of the quantity, or any combination thereof.

In some examples of the method 700 and apparatuses described herein, receiving the code word may further include retrieving each code word of a plurality of code words retained at the portion of the memory medium as part of a periodic background operation independent of an access command from a host, where accessing the memory array may be based on retrieving each code word of the plurality.

Figure 8:
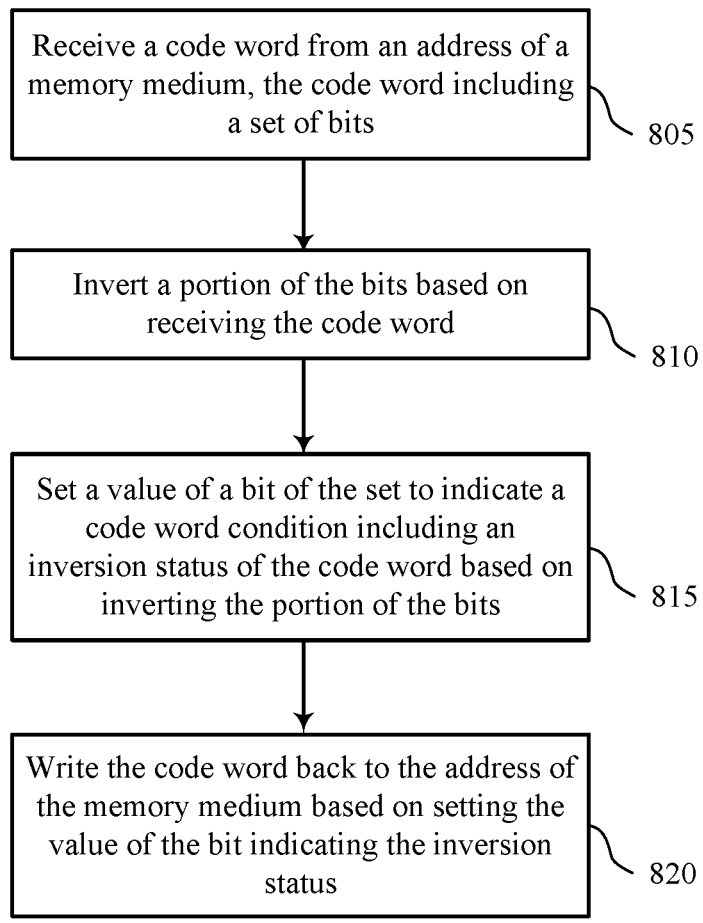

FIG. 8 shows a flowchart illustrating a method 800 that supports media scrubber operations in a memory system in accordance with aspects disclosed herein. The operations of method 800 may be implemented by a controller or its components as described with reference to FIGS. 1 through 2. For example, the operations of method 800 may be performed by the controller 120 or the controller 230 described with reference to FIGS. 1 through 2. In some examples, a controller 230 may execute a set of codes to control the functional elements of the device to perform the functions described below. Additionally or alternatively, the controller 230 may perform aspects of the functions described below using special-purpose hardware.

At 805 the controller 230 may receive a code word from an address of a memory medium, the code word including a set of bits. The operations of 805 may be performed according to the methods described with reference to FIGS. 1-5. In certain examples, aspects of the operations of 805 may be performed by an access manager as described with reference to FIG. 5.

At 810 the controller 230 may invert a portion of the bits based on receiving the code word. The operations of 810 may be performed according to the methods described with reference to FIGS. 1-5. In certain examples, aspects of the operations of 810 may be performed by a code word manager as described with reference to FIG. 5.

At 815 the controller 230 may set a value of a bit of the set to indicate a code word condition including an inversion status of the code word based on inverting the portion of the bits. The operations of 815 may be performed according to the methods described with reference to FIGS. 1-5. In certain examples, aspects of the operations of 815 may be performed by a code word manager as described with reference to FIG. 5.

At 820 the controller 230 may write the code word back to the address of the memory medium based on setting the value of the bit indicating the inversion status. The operations of 820 may be performed according to the methods described with reference to FIGS. 1-5. In certain examples, aspects of the operations of 820 may be performed by an access manager as described with reference to FIG. 5.

An apparatus for performing a method or methods, such as the method 800, is described. The apparatus may include means for receiving a code word from an address of a memory medium, the code word including a set of bits, means for inverting a portion of the bits based on receiving the code word, means for setting a value of a bit of the set to indicate a code word condition including an inversion status of the code word based on inverting the portion of the bits, and means for writing the code word back to the address of the memory medium based on setting the value of the bit indicating the inversion status.

Another apparatus for performing a method or methods, such as the method 800, is described. The apparatus may include a memory medium and a controller in electronic communication with the memory medium, where the controller may be operable to receive a code word from an address of a memory medium, the code word including a set of bits, invert a portion of the bits based on receiving the code word, set a value of a bit of the set to indicate a code word condition including an inversion status of the code word based on inverting the portion of the bits, and write the code word back to the address of the memory medium based on setting the value of the bit indicating the inversion status.

In some examples of the method 800 and apparatuses described herein, the portion of the bits may include every bit of the set. In some examples of the method 800 and apparatuses described herein, receiving the code word may further include retrieving each code word of a plurality of code words retained at the memory medium as part of a periodic background operation independent of an access command from a host, where inverting the portion of the bits may be based on serially retrieving each code word of the plurality.

It should be noted that the methods described herein describe possible implementations, and that the operations and the steps may be rearranged or otherwise modified and that other implementations are possible. Further, examples from two or more of the methods may be combined.

Information and signals described herein may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof. Some drawings may illustrate signals as a single signal; however, it will be understood by a person of ordinary skill in the art that the signal may represent a bus of signals, where the bus may have a variety of bit widths.

The term "electronic communication" and "coupled" refer to a relationship between components that support electron flow between the components. This may include a direct connection between components or may include intermediate components. Components in electronic communication or coupled to one another may be actively exchanging electrons or signals (e.g., in an energized circuit) or may not be actively exchanging electrons or signals (e.g., in a de-energized circuit) but may be configured and operable to exchange electrons or signals upon a circuit being energized. By way of example, two components physically connected via a switch (e.g., a transistor) are in electronic communication or may be coupled regardless of the state of the switch (i.e., open or closed).

Chalcogenide materials may be materials or alloys that include at least one of the elements S, Se, and Te. Phase change materials discussed herein may be chalcogenide materials. Chalcogenide materials may include alloys of S, Se, Te, Ge, As, Al, Sb, Au, indium (In), gallium (Ga), tin (Sn), bismuth (Bi), palladium (Pd), cobalt (Co), oxygen (O), silver (Ag), nickel (Ni), platinum (Pt). Example chalcogenide materials and alloys may include, but are not limited to, Ge—Te, In—Se, Sb—Te, Ga—Sb, In—Sb, As—Te, Al—Te, Ge—Sb—Te, Te—Ge—As, In—Sb—Te, Te—Sn—Se, Ge—Se—Ga, Bi—Se—Sb, Ga—Se—Te, Sn—Sb—Te, In—Sb—Ge, Te—Ge—Sb—S, Te—Ge—Sn—O, Te—Ge—Sn—Au, Pd—Te—Ge—Sn, In—Se—Ti—Co, Ge—Sb—Te—Pd, Ge—Sb—Te—Co, Sb—Te—Bi—Se, Ag—In—Sb—Te, Ge—Sb—Se—Te, Ge—Sn—Sb—Te, Ge—Te—Sn—Ni, Ge—Te—Sn—Pd, or Ge—Te—Sn—Pt. The hyphenated chemical composition notation, as used herein, indicates the elements included in a particular compound or alloy and is intended to represent all stoichiometries involving the indicated elements. For example, Ge—Te may include $Ge_xTe_y$, where x and y may be any positive integer. Other examples of variable resistance materials may include binary metal oxide materials or mixed valence oxide including two or more metals, e.g., transition metals, alkaline earth metals, and/or rare earth metals. Examples are not limited to a particular variable resistance material or materials associated with the memory elements of the memory cells. For example, other examples of variable resistance materials can be used to form memory elements and may include chalcogenide materials, colossal magnetoresistive materials, or polymer-based materials, among others.

The devices discussed herein, including memory media 130, may be formed on a semiconductor substrate, such as silicon, germanium, silicon-germanium alloy, gallium arsenide, gallium nitride, etc. In some cases, the substrate is a semiconductor wafer. In other cases, the substrate may be a silicon-on-insulator (SOI) substrate, such as silicon-on-glass (SOG) or silicon-on-sapphire (SOP), or epitaxial layers of semiconductor materials on another substrate. The conductivity of the substrate, or sub-regions of the substrate, may be controlled through doping using various chemical species including, but not limited to, phosphorous, boron, or arsenic. Doping may be performed during the initial formation or growth of the substrate, by ion-implantation, or by any other doping means.

The description set forth herein, in connection with the appended drawings, describes example configurations and does not represent all the examples that may be implemented or that are within the scope of the claims. The term "exemplary" used herein means "serving as an example, instance, or illustration," and not "preferred" or "advantageous over other examples." The detailed description includes specific details for the purpose of providing an understanding of the described techniques. These techniques, however, may be practiced without these specific details. In some instances, well-known structures and devices are shown in block diagram form in order to avoid obscuring the concepts of the described examples.

In the appended figures, similar components or features may have the same reference label. Further, various components of the same type may be distinguished by following the reference label by a dash and a second label that distinguishes among the similar components. If just the first reference label is used in the specification, the description is applicable to any one of the similar components having the same first reference label irrespective of the second reference label.

Information and signals described herein may be represented using any of a variety of different technologies and techniques. For example, data, instructions, commands, information, signals, bits, symbols, and chips that may be referenced throughout the herein description may be represented by voltages, currents, electromagnetic waves, magnetic fields or particles, optical fields or particles, or any combination thereof.

The various illustrative blocks and modules described in connection with the disclosure herein may be implemented or performed with a general-purpose processor, a DSP, an ASIC, an field programmable gate array (FPGA) or other programmable logic device, discrete gate or transistor logic, discrete hardware components, or any combination thereof designed to perform the functions described herein. A general-purpose processor may be a microprocessor, but in the alternative, the processor may be any conventional processor, controller, microcontroller, or state machine. A processor may also be implemented as a combination of computing devices (e.g., a combination of a digital signal processor (DSP) and a microprocessor, multiple microprocessors, one or more microprocessors in conjunction with a DSP core, or any other such configuration).

The functions described herein may be implemented in hardware, software executed by a processor, firmware, or any combination thereof. If implemented in software executed by a processor, the functions may be stored on or transmitted over as one or more instructions or code on a computer-readable medium. Other examples and implementations are within the scope of the disclosure and appended claims. For example, due to the nature of software, functions described herein can be implemented using software executed by a processor, hardware, firmware, hardwiring, or combinations of any of these. Features implementing functions may also be physically located at various positions, including being distributed such that portions of functions are implemented at different physical locations. Also, as used herein, including in the claims, "or" as used in a list of items (for example, a list of items prefaced by a phrase such as "at least one of" or "one or more of") indicates an inclusive list such that, for example, a list of at least one of A, B, or C means A or B or C or AB or AC or BC or ABC (i.e., A and B and C). Also, as used herein, the phrase "based on" shall not be construed as a reference to a closed set of conditions. For example, an exemplary step that is described as "based on condition A" may be based on both a condition A and a condition B without departing from the scope disclosed herein. In other words, as used herein, the phrase "based on" shall be construed in the same manner as the phrase "based at least in part on."

Computer-readable media includes both non-transitory computer storage media and communication media including any medium that facilitates transfer of a computer program from one place to another. A non-transitory storage medium may be any available medium that can be accessed by a general purpose or special purpose computer. By way of example, and not limitation, non-transitory computer-readable media can include RAM, ROM, electrically erasable programmable read only memory (EEPROM), compact disk (CD) ROM or other optical disk storage, magnetic disk storage or other magnetic storage devices, or any other non-transitory medium that can be used to carry or store desired program code means in the form of instructions or data structures and that can be accessed by a general-purpose or special-purpose computer, or a general-purpose or special-purpose processor. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, digital subscriber line (DSL), or wireless technologies such as infrared, radio, and microwave are included in the definition of medium. Disk and disc, as used herein, include CD, laser disc, optical disc, digital versatile disc (DVD), floppy disk and Blu-ray disc where disks usually reproduce data magnetically, while discs reproduce data optically with lasers. Combinations of the above are also included within the scope of computer-readable media.

The description herein is provided to enable a person skilled in the art to make or use the disclosure. Various modifications to the disclosure will be readily apparent to those skilled in the art, and the generic principles defined herein may be applied to other variations without departing from the scope of the disclosure. Thus, the disclosure is not limited to the examples and designs described herein, but is to be accorded the broadest scope consistent with the principles and novel features disclosed herein.

What is claimed is:

1. A method, comprising:
   receiving a code word from a first memory array of a memory medium, the code word comprising a plurality of bits;
   obtaining a substitution relationship from a second memory array, the substitution relationship indicating a first bit of the plurality of bits to be replaced by a spare bit of the plurality of bits;
   replacing the first bit with the spare bit in the code word according to the substitution relationship;
   performing, after replacing the first bit with the spare bit in the code word, an error control operation on the code word to restore logic states of the plurality of bits; and
   writing a restored logic state to the spare bit, the restored logic state corresponding to a logic state of the first bit.

2. The method of claim 1, wherein performing the error control operation on the code word is based at least in part on replacing the first bit with the spare bit in the code word.

3. The method of claim 1, further comprising:
   identifying a value of a flag in the second memory array, the value of the flag indicating a change in the substitution relationship, wherein obtaining the substitution relationship from the second memory array is based at least in part on identifying the value of the flag.

4. The method of claim 1, further comprising:
   resetting a value of a flag in the second memory array based at least in part on writing the restored logic state to the spare bit, the value of the flag indicating that the spare bit comprises the restored logic state corresponding to the logic state of the first bit.

5. The method of claim 1, wherein the substitution relationship comprises:
   an indication of a change in the substitution relationship, an identification of a channel associated with the code word, a quantity of spare bits in the code word, an identification of a Minimum Substitution Region (MSR) of a first quantity of MSRs associated with the code word, a quantity of bits associated with forwarded code words in the memory medium, an error correction capability for the substitution relationship, a quantity of memory dice corresponding to the channel associated with the code word, or a second quantity of MSR groups in a memory die of the quantity of memory dice, or any combination thereof.

6. The method of claim 1, wherein the code word is one of a plurality of code words retained at the first memory array and wherein receiving the code word from the first memory array further comprises:
   retrieving each code word of the plurality of code words from the first memory array as part of a periodic background operation independent of an access command, wherein obtaining the substitution relationship from the second memory array is based at least in part on retrieving each code word of the plurality of code words from the first memory array.

7. The method of claim 1, further comprising:
   determining that the first bit is an erroneous bit;
   assigning the spare bit to replace the first bit in the code word, based on determining that the first bit is an erroneous bit;
   setting a flag in the second memory array to indicate a change in the substitution relationship, based on assigning the spare bit to replace the first bit in the code word; and
   saving the substitution relationship to the second memory array, based on setting the flag in the second memory array, wherein receiving the code word from the first memory array occurs subsequent to saving the substitution relationship to the second memory array.

8. The method of claim 7, wherein determining that the first bit is an erroneous bit comprises:
   performing a second error control operation on the code word.

9. An apparatus, comprising:
   a memory medium comprising a first memory array configured to generate a code word;
   a second memory array; and
   a controller in electronic communication with the first memory array and the second memory array, the controller operable to:
   receive the code word from the the first memory array, the code word comprising a plurality of bits;
   obtain a substitution relationship from the second memory array, the substitution relationship indicating a first bit of the plurality of bits to be replaced by a spare bit of the plurality of bits;
   replace the first bit with the spare bit in the code word according to the substitution relationship;
   perform, after replacing the first bit with the spare bit in the code word, an error control operation on the code word to restore logic states of the plurality of bits; and
   write a restored logic state to the spare bit, the restored logic state corresponding to a logic state of the first bit.

10. The apparatus of claim 9, wherein performing the error control operation on the code word is based at least in part on replacing the first bit with the spare bit in the code word.

11. The apparatus of claim 9, wherein the controller is further configured to:
    identify a value of a flag in the second memory array, the value of the flag indicating a change in the substitution relationship, wherein obtaining the substitution relationship from the second memory array is based at least in part on identifying the value of the flag.

12. The apparatus of claim 9, wherein the controller is further configured to:
    reset a value of a flag in the second memory array based at least in part on writing the restored logic state to the spare bit, the value of the flag indicating that the spare bit comprises the restored logic state corresponding to the logic state of the first bit.

13. The apparatus of claim 9, wherein the substitution relationship comprises:
an indication of a change in the substitution relationship, an identification of a channel associated with the code word, a quantity of spare bits in the code word, an identification of a Minimum Substitution Region (MSR) of a first quantity of MSRs associated with the code word, a quantity of bits associated with forwarded code words in the memory medium, an error correction capability for the substitution relationship, a quantity of memory dice corresponding to the channel associated with the code word, or a second quantity of MSR groups in a memory die of the quantity of memory dice, or any combination thereof.

14. The apparatus of claim 9, wherein the code word is one of a plurality of code words retained at the first memory array and wherein the controller is further configured to:
retrieve each code word of the plurality of code words from the first memory array as part of a periodic background operation independent of an access command, wherein obtaining the substitution relationship from the second memory array is based at least in part on retrieving each code word of the plurality of code words from the first memory array.

15. A non-transitory computer-readable medium storing code, the code comprising instructions executable by a processor to:
receive a code word from a first memory array of a memory medium, the code word comprising a plurality of bits;
obtain a substitution relationship from a second memory array, the substitution relationship indicating a first bit of the plurality of bits to be replaced by a spare bit of the plurality of bits;
replace the first bit with the spare bit in the code word according to the substitution relationship;
perform, after replacing the first bit with the spare bit in the code word, an error control operation on the code word to restore logic states of the plurality of bits; and
write a restored logic state to the spare bit, the restored logic state corresponding to a logic state of the first bit.

16. The non-transitory computer-readable medium of claim 15, wherein performing the error control operation on the code word is based at least in part on replacing the first bit with the spare bit in the code word.

17. The non-transitory computer-readable medium of claim 15, wherein the instructions are further executable by the processor to:
identify a value of a flag in the second memory array, the value of the flag indicating a change in the substitution relationship, wherein obtaining the substitution relationship from the second memory array is based at least in part on identifying the value of the flag.

18. The non-transitory computer-readable medium of claim 15, wherein the instructions are further executable by the processor to:
reset a value of a flag in the second memory array based at least in part on writing the restored logic state to the spare bit, the value of the flag indicating that the spare bit comprises the restored logic state corresponding to the logic state of the first bit.

19. The non-transitory computer-readable medium of claim 15, wherein the substitution relationship comprises:
an indication of a change in the substitution relationship, an identification of a channel associated with the code word, a quantity of spare bits in the code word, an identification of a Minimum Substitution Region (MSR) of a first quantity of MSRs associated with the code word, a quantity of bits associated with forwarded code words in the memory medium, an error correction capability for the substitution relationship, a quantity of memory dice corresponding to the channel associated with the code word, or a second quantity of MSR groups in a memory die of the quantity of memory dice, or any combination thereof.

20. The non-transitory computer-readable medium of claim 15, wherein the code word is one of a plurality of code words retained at the first memory array and wherein the instructions are further executable by the processor to:
retrieve each code word of the plurality of code words from the first memory array as part of a periodic background operation independent of an access command, wherein obtaining the substitution relationship from the second memory array is based at least in part on retrieving each code word of the plurality of code words from the first memory array.

\* \* \* \* \*